United States Patent [19]

Van Voorhis

[11] 3,925,780

[45] Dec. 9, 1975

[54] APPARATUS FOR DATA COMPRESSION ENCODING AND DECODING

[75] Inventor: David C. Van Voorhis, Los Gatos, Calif.

[73] Assignee: International Business Machines Corporation, New York, N.Y.

[22] Filed: Dec. 26, 1973

[21] Appl. No.: 428,500

[52] U.S. Cl. .................... 340/347 DD; 178/DIG. 3

[51] Int. Cl.$^2$ .................... H03K 13/24

[58] Field of Search .................... 340/347 DD, 172.5; 178/DIG. 3, 6

[56] References Cited

UNITED STATES PATENTS

| | | | |
|---|---|---|---|
| 3,560,639 | 2/1971 | Centanni | 178/6 |
| 3,813,485 | 5/1974 | Arps | 178/DIG. 3 |

*Primary Examiner*—Charles D. Miller

*Attorney, Agent, or Firm*—Owen L. Lamb

[57] ABSTRACT

A method and apparatus for decoding ordinary run length codes and run length codes that have been extended to include two classes of code words, "regular" code words for runs and "special" code words for selected special situations. The decoder comprises table storage and select/combine circuitry. The table storage holds four small tables whose values can be adjusted to correspond to any ordinary or extended run length code to be implemented. The select/combine circuitry receives successive code word bits, uses successive elements of one table to isolate the bits comprising a code word, and then combines the code word with other table values in order to calculate a binary value uniquely identifying the code word.

2 Claims, 23 Drawing Figures

| ENCODER TABLE K | CABLE 23 Br | CABLE 23 Bs | CABLE 24 Tr | CABLE 24 Ts |
|---|---|---|---|---|
| 1 | 00 | 00 | 00 | 00 |
| 2 | 001 | 001 | 001 | 010 |
| 3 | 0010 | 0010 | 0101 | 0110 |
| 4 | 00101 | 00010 | 01111 | 01111 |
| 5 | 000111 | 000010 | 100000 | 100000 |

| DECODER TABLES K | CABLE 77 Br | CABLE 75 Bs | CABLE 76 Tr | CABLE 74 Ts |
|---|---|---|---|---|
| 1 | 00 | 00 | 00 | 00 |
| 2 | 001 | 001 | 001 | 010 |
| 3 | 0010 | 0010 | 0101 | 0110 |
| 4 | 00101 | 00010 | 01111 | 01111 |
| 5 | 000111 | 000010 | 100000 | 100000 |

APPARATUS FOR DATA COMPRESSION ENCODING AND DECODING

BACKGROUND OF THE INVENTION

The invention relates to data compression techniques for digital images, and more particularly, to a method and apparatus for decoding the ordinary and extended run-length codes required by such techniques.

A digital image is a two-dimensional array of image points, each of which represents the light intensity of a small area of a physical picture. For black/white images, each image point is a single bit of information with a value of either 0 or 1 to indicate respectively, that the corresponding area of the picture is light or dark. These images are normally generated by scanning pictorial data, such as 8½ inch × 11 inch documents. Thereafter, the scanned pictorial data can be stored, viewed from a display, transmitted, or printed.

A variety of data compression techniques have been devised for reducing the storage requirements for digital images, and for reducing the bandwidth required for their transmission. Most of these techniques are based on some form of run length coding.

In its simplest form, run length coding of images involves two steps. First, there is the partitioning of each row of the image array into a sequence of "runs," with each run comprising one or more adjacent image points with the same binary value, i.e., 0 or 1. Second, it is necessary to replace each run of image points with a single integer that specifies the length of the run. For example, a run of 10 successive image points with the value of 0 can be replaced by the single integer 10. It is not necessary to identify explicitly the binary value of each run. It is sufficient to specify the binary value of the first run in each row, since the binary values of successive runs alternate between 0 and 1.

More efficient run length coding techniques use variable length binary code words, rather than integers, to represent the lengths of the various runs. The run length codes used with such techniques are designed so that the shorter code words are used to represent more frequently occurring runs and the longer code words are used for less frequently occurring runs. For typical applications the runs of lengths 1 to 5 occur most frequently. The probability of occurrence for successively longer runs tends to decrease steadily thereafter. There is one single exception, that is the longest possible run. Such a run can, for example, represent a completely white line on the printed page, which occurs frequently. Since the probability of occurrence tends to decrease with the length of a run, the length of the code word used to represent a run generally increases with the length of the run. For example, a run of length 20 is normally represented by a code word that is longer than the code word used for a run of length 10.

A slightly different group of run length coding techniques have been used when the number of image points with a binary value of 0 far exceeds the numer of image points with a binary value of 1. These techniques partition each row of the image array into a number of runs of 0's, each separated by a single 1. Then, only the runs of 0's are encoded. Although it is sometimes necessary to encode the run of "no 0's" that appears between two adjacent 1's in a row of the image array, it is not necessary to encode any runs of 1's. This strategy is particularly effective when used in conjunction with predictive encoding, which transforms an original image array into a new array that includes few 1's. See, for example, L. Bahl et al., U.S. Pat. No. 3,769,453, "Finite Memory Adaptive Predictor."

Finally, a few sophisticated data compression techniques for images use run lengths codes that have been extended to include a number of "special" code words in order to represent certain special situations. These special code words are used in conjunction with the "regular" code words used to represent runs. An example is the code described by I. Gorog et al. in the article entitled "An Experimental Low Cost Graphic Information Distribution Terminal," 1971 SID International Symposium of Technical Papers. Gorog's code includes three special code words for special situations. These special situations are the occasion that a run in one row of an image array either ends directly beneath the end point of a corresponding run in the previous row, or ends one position to the left or right of this end point.

The primary disadvantage of previous run length coding systems is that they have used an ordinary or extended run length code which represented a compromise among three coding objectives. The objectives are high efficiency for typical images, uniformly high efficiency for a class of images, and an economical implementation. In this regard, reference should be made to N. Abramson, "Information Theory and Coding," McGraw Hill Book Co., New York, 1963 at pp. 85–88 for a discussion for code efficiency. Abramson's efficiency measure is based upon the value of a symbol from an information source S, which can be measured in terms of an equivalent number of binary digits needed to represent one symbol from that source. The average value of a symbol from S is denoted by $H(S)$. Note that $H(S)=_{i}p_i\log(1/p_i)$, where $p_i$ is the probability of the ith source symbol. Given that L is the average code word length for any uniquely decodable code for the source, it is the case that L cannot be less than $H(S)$. Accordingly, the efficiency of the code is the ratio of $H(S)/L$.

Taking the above coding objectives into account, the most easily implemented run length code, which uses the fixed length binary integer $i$ as a code word for runs of length $i$, is not nearly as efficient as a variable length code. On the other hand, the most efficient extended run length code possible for a sample of images is the Huffman code based on the relative frequencies of runs and special situations in the sample of images. However, since run length codes for images typically require 1 to 5,000 code words, the Huffman code is normally difficult to implement.

Three general types of decoders are currently in use. These are the tree follower types; a table lookup type; and an encoder based type.

A tree follower decoder depends on the fact that standard variable length binary codes have a tree-like structure. The decoder includes logic circuitry corresponding to the tree, and successive code word bits cause control circuitry to traverse this tree structure. When a terminal node of the tree is reached, an entire code word has been received, and the terminal node identifies the code word.

A table lookup decoder includes a table containing each code word as a separate entity. As successive code word bits are received, each code word must be checked to see whether it agrees with all code word bits received so far. When only one code word agrees, that code word has been received and identified. The table storage required by this table lookup type of decoder is expensive.

An encoder based decoder includes a copy of the encoder, a bit generator, and comparison circuitry. The bit generator supplies a sequence of bits to the encoder. The encoder continuously produces the code word appropriate for the run comprising the bits generated so far. Each code word thus produced is compared with code word bits received. When a match occurs, the decoded run length is taken to be the number of bits generated by the bit generator.

SUMMARY OF THE INVENTION

It is therefore an object of this invention to provide a method and apparatus for decoding ordinary and extended run length codes that are both highly efficient for a sample of images and uniformly efficient for a class of images.

The above and other objects are believed satisfied by the description of a preferred embodiment of the invention, the apparatus comprising table storage and select/combine circuitry. The table storage is sufficient to hold four small tables whose values can be adjusted to correspond to any ordinary or extended run length code. The select/combine circuitry accepts as input the successive bits of a code word and compares the bits received so far with successive elements of one stored table until it is determined that an entire code word has been received. Then, this code word is combined with other table values to produce a binary value which uniquely identifies the code word received.

More particularly, the disclosed apparatus comprises a decoder that can isolate and identify a code word for a specific class of ordinary and extended run length codes. As will be shown, this class of codes includes a code of uniformly high efficiency for any desired data compression technique and any desired class of images.

The class of codes to be implemented includes the ordinary and extended run length codes characterized by three parameters, a maximum number N of regular code words, a maximum number M of special code words, and a maximum code word length $L_{max}$.

The class of codes to be implemented is further restricted by the requirements that the code word lengths $L_r(1)$, $L_r(2)$, . . . for the regular code words $c_r(1)$, $c_r(2)$, . . . must be monotonically increasing. The code word lengths $L_s(1)$, $L_s(2)$, . . . for the various special code words $c_s(1)$, $c_s(2)$, must also be monotonically increasing. That is, the code word lengths must satisfy the relations $$1 \leq L_r(1) \leq L_r(2) \leq \ldots \leq L_{max};$$
$$1 \leq L_s(1) \leq L_s(2) \leq \ldots \leq L_{max}.$$

Finally, the code words for the codes to be implemented must be related algebraically to the elements of four small tables BR=$[b_r(1), b_r(2), \ldots b_r(L_{max})]$, BS=$[b_s(1), b_s(2), \ldots, b_s(L_{max})]$, TR=$[t_r(1), t_r(2), \ldots, t_r(L_{max})]$, and TS=$[t_s(1), t_s(2), \ldots, t_s(L_{max})]$, whose values are determined by the code word lengths according to the formulas $b_r(k)$=number of regular code words with length $k$ or less;

$b_s(k)$=number of special code words with length $k$ or less;

$$t_r(k) = \sum_{i=1}^{b_r(k)} 2^{k-L_r(i)} + \sum_{j=1}^{b_s(k-1)} 2^{k-L_s(j)},$$

$$t_s(k) = \sum_{i=1}^{b_r(k)} 2^{k-L_r(i)} + \sum_{j=1}^{b_s(k)} 2^{k-L_s(j)}$$

In particular, the regular and special code words for codes to be implemented must be the binary integers related to these table values according to the formulas $$c_r(i)=t_r(L_r(i))-b_r(L_r(i))+i-1;$$
$$c_s(j)=t_s(L_s(j))-b_s(L_s(j))+j-1.$$

These relationships between the monotonically increasing code word lengths, the table values, and the code words themselves are illustrated in Tables 1 and 2 for a code which includes seven regular code words and two special code words.

Table 1

| SAMPLE CODE | | | | |
|---|---|---|---|---|
| i | $L_r(i)$ | $L_s(i)$ | $c_r(i)$ | $c_s(i)$ |
| 1 | 2 | 2 | 00 | 01 |
| 2 | 3 | 3 | 100 | 101 |
| 3 | 4 | — | 1100 | — |
| 4 | 4 | — | 1101 | — |
| 5 | 4 | — | 1110 | — |
| 6 | 5 | — | 11110 | — |
| 7 | 5 | — | 11111 | — |

Table 2

| TABLE VALUES FOR SAMPLE CODES | | | | |
|---|---|---|---|---|
| k | $b_r(k)$ | $b_s(k)$ | $t_r(k)$ | $t_s(k)$ |
| 1 | 0 | 0 | 0 | 0 |
| 2 | 1 | 1 | 1 | 2 |
| 3 | 2 | 2 | 5 | 6 |
| 4 | 5 | 2 | 15 | 15 |
| 5 | 7 | 2 | 32 | 32 |

A simple example will serve to illustrate that the class of ordinary and extended run length codes implemented by the disclosed decoder includes a code with uniformly high efficiency for any desired data compression technique and any desired class of images.

Suppose that the desired compression technique requires an extended run length code with code words for runs of lengths 1 through $n$, and with code words for m special situation. Then, the relative frequencies of occurrence for the various runs and special situations may be measured in a sample of images, and these relative frequencies may be used to separate the runs and special situations into two ordered lists of events. In particular, the successive regular events are the runs with lengths $f$ through $n-1$, where $f$ is the length of the most frequently occurring run. The successive special events are the m special situations plus the runs with lengths 1 through $f-1$ and the runs of length $n$, all taken in order of decreasing frequency of occurrence. The relative frequencies of the $n-f$ regular events and the m+f special events are used to calculate code word lengths that are ordered and bounded according to the two relations $$1 \leq L_r(1) \leq L_r(2) \leq \ldots \leq L_r(n-f) \leq L_{max},$$
$$1 \leq L_s(1) \leq L_s(2) \leq \ldots \leq L_s(m+f) \leq L_{max},$$

and that lead to the minimum average code word length permitted by these relations. Finally, the code word lengths are used in the previously provided formulas to calculate values for the BR, BS, TR, and TS tables, and hence to calculate the $n-f$ regular code words $c_r(1)$, $c_r(2)$, . . . , $c_r(n-f)$ and the m+f special code words $c_s(1)$, $c_s(2)$, . . . , $c_s(m+f)$.

The simple code construction technique just described constructs an extended run length code whose code word lengths are both monotonically increasing and bounded. As will be shown, this code is normally both highly efficient for the sample images and uniformly efficient for similar images not in the sample.

For typical data compression techniques the relative frequencies for runs reaches its maximum value for runs of length $f$, where $f$ is less than 5, and then the relative frequencies for successively longer runs tend to decrease for runs with lengths between $f$ and $n-1$. Therefore, the above code construction technique places the regular events approximately in order of decreasing relative frequency, and it places the special events exactly in order of decreasing relative frequency, so that monotonically increasing codeword lengths lead to a code that is highly efficient for the sample images. Furthermore, E. N. Gilbert shows in his article "Codes Based on Inaccurate Source Probabilities," IEEE Transactions on Information Theory, Vol. IT-17, pp. 304–314, May 1971, that using a bound $L_{max} \geq \log_2(n+m)$ for the length of the longest codewords tends to promote uniformly high code efficiency.

The operation of the disclosed decoder, which uses the stored tables BR, BS, and TS to isolate and identify codewords can be summarized as follows. As successive bits $Y_1, Y_2, \ldots$ of a codeword are received, the select/combine circuitry concatenates these bits into a single integer for comparison with successive elements of the TS table. When for some value of $k$ the resulting $k$-bit integer $y = y_1y_2 \ldots y_k$ is found to satisfy the relation $y<t_s(k)$, it is known that $y$ is a $k$-bit codeword which must be identified. To this end, the codeword y is compared with the table value $t_r(k)$. If $y<t_r(k)$, then the decoder calculates the event designation $$s=0$$
$$i=y-t_r(k)+b_r(k)+1,$$

which signifies that $y$ is the ith regular codeword $c_r(i)$. Alternatively, if $y \geq t_r(k)$, then the decoder calculates the event designation $$s=1,$$
$$i=y-t_s(k)+b_s(k)+1,$$

which signifies that y is the ith special codeword $c_s(i)$.

DESCRIPTION OF PREFERRED EMBODIMENTS

The data compression encoding and decoding circuitry of the present invention may be implemented in various preferred forms and arrangements. One such embodiment is illustrated by the encoding arrangement of FIG. 1 and the decoding arrangement of FIG. 2.

Figure 1:
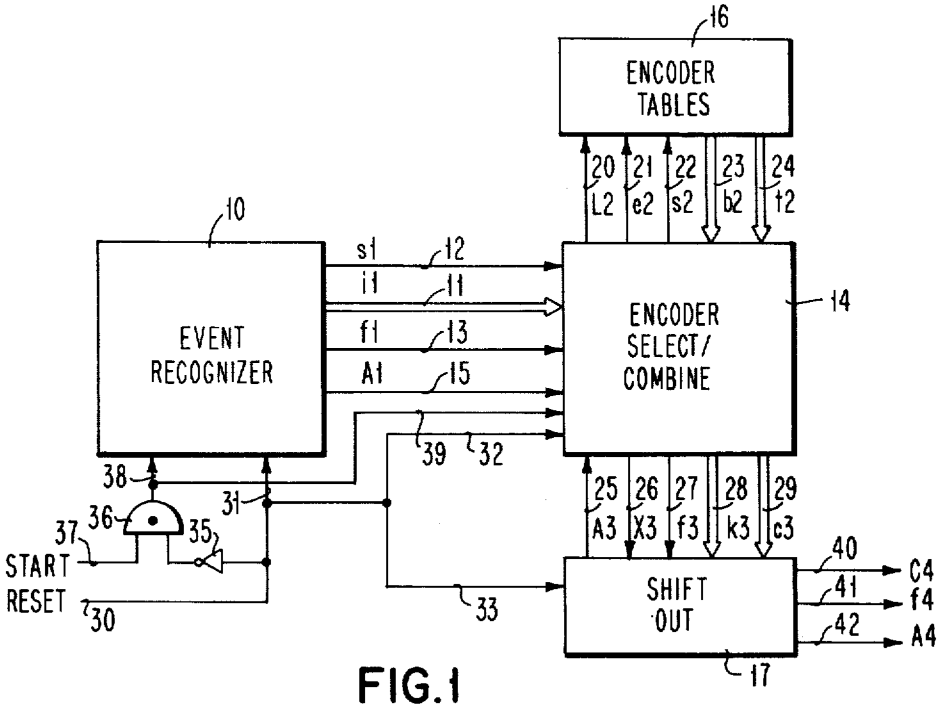
FIG. 1 is a generalized block diagram of a data compression encoding apparatus in accordance with the present invention.

FIG. 1 includes an event recognizer 10. The present invention relates to the compression of information, wherein elements of information may be characterized as events. An information element, or event, may comprise a binary encoded representation of an alphanumeric character, an analog voltage, a run of binary video information, a run of binary image information, or any other type of information capable of recognition. The events may be further characterized as regular or special.

The event recognizer 10 is designed to recognize each element of the specific type of information which is presented to it and to supply a binary output therefrom characterizing each received unit of information. The event characterization comprises a single bit of information to indicate whether the event is regular or special, and an event designation number that uniquely identifies the event.

Although the present invention can be employed in a wide variety of information environments, including those in which no events are classified as special, it is currently anticipated that the most advantageous usage of the present invention will be in the field of run length encoding. In such a circumstance, the event recognizer 10 may recognize each sequence of consecutive bits of the same logic level, which is denoted as a run. Runs may also be sequences of bits of one of the logic levels, or sequences of a level terminating in another level. All runs can be classified as regular events, and the event designation number for a run can simply be the length of that run. Alternatively, runs of certain lengths can be classified as special events. For example, runs of length 1 or 2 can be classified as special events and characterized by event designation numbers 1 or 2, while the remaining runs can be classified as regular events, with the event designation number for a run of length 3 or greater simply two less than the length of that run. Thus, a run of length 4 would be characterized by event recognizer 10 as regular event No. "2", whereas a run of length 2 would be characterized as special event No. 2. The event designation number is supplied by the event recognizer 10 on parallel cable 11 together with a bit on line 12 which indicates whether the designation on line 11 refers to a regular event or a special event, and together with a signal on line 13 which indicates that the event designation information is available on cable 11 and line 12. An example of a suitable event recognizer will be described in detail hereinafter.

The signals from the event recognizer 10 are supplied to an encoder 14. The encoder signals acceptance of the information on cable 11 and line 12 by providing an "accept" pulse signal on line 15 to the event recognizer 10. The information shown as being received on cable 11 in parallel may alternatively be supplied in the form of serial information over a single line. The parallel transmission of such information, however, appears to be the more efficient approach.

The encoder 14 responds to the signal supplied from event recognizer 10 by selecting the appropriate entries from encoder tables 16 corresponding to the event designation appearing on cable 11 and line 12. The encoder then combines the selected values with the event designation number from cable 11 to generate a code word representation therefor, which is supplied to shift out circuitry 17 for conversion from parallel to serial form.

Encoder 14 is connected to the encoder tables 16 by lines 20, 21 and 22, and by cables 23 and 24. Line 21 comprises an enabling line operated by acceptance of the immediately prior code word by shift out circuitry 17. The enabling signal, together with a pulse in line 20, causes the contents of tables to be loaded into table readout circuitry. Successive pulses on line 20 are used to operate the table readout circuitry. Line 22 comprises the special or regular signal from event recognizer 10 on line 12. Cables 23 and 24 comprise the outputs from the table readout circuitry which supply the table values to encoder 14.

The encoder is connected to shift out circuitry 17 by means of lines 25, 26 and 27, and by cables 28 and 29. Cable 29 comprises the codeword in parallel and includes enough lines to encompass the longest codeword. Cable 28 comprises the designation of the length of the codeword on cable 29 so that the unused lines comprising the remainder of cable 29 may be ignored. A signal on line 27 indicates that the codeword is present on cable 29. Line 26 comprises an output from a clock source in encoder 14 to control the enabling of circuitry 17. A pulse on line 25 indicates to the encoder 14 that shift out circuitry 17 has accepted the codeword on cable 29.

Initialization circuitry is also provided which includes a reset input 30 that is supplied to inputs 31–33 to initially reset the encoding circuitry and is supplied via inverter 35 to AND circuit 36 to prevent initialization until the reset is complete. A start signal is supplied at input 37 to AND circuit 36. It is then supplied to inputs 38 and 39 of the encoding circuitry.

Shift out circuitry 17 is connected to a transmission link or a storage device by lines 40–42. A signal on line 41 indicates that the codeword can be shifted out in serial form on line 40, and line 42 comprises an acceptance and timing line from the transmission link or storage device.

Figure 2:
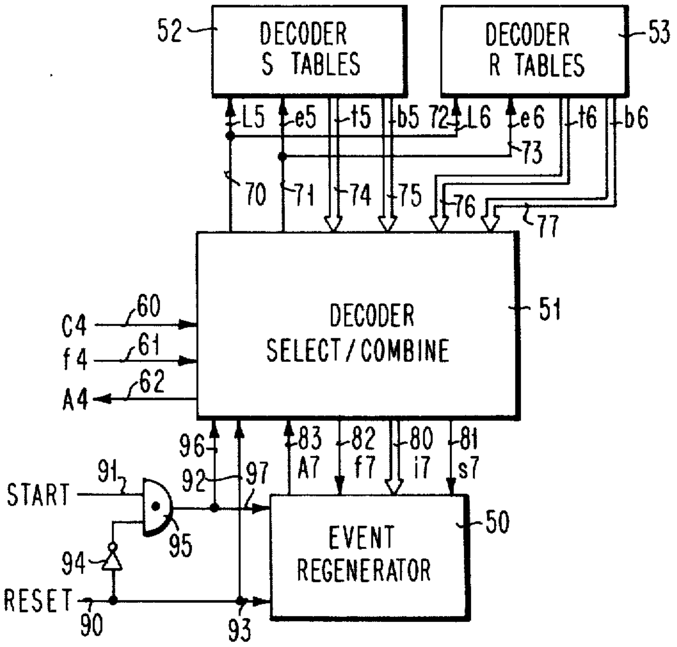
FIG. 2 is a generalized block diagram of a data compression decoder in accordance with the present invention.

Referring to FIG. 2, the decoding circuitry and event regenerator 50 are illustrated. The event regenerator responds to the decoded signals from decoder 51, which operates with respect to decoder tables 52 and 53 to reproduce the original event designation generated by event recognizer 10 in FIG. 1.

Input lines 60–62 to decoder 51 may be connected directly to lines 40–42, respectively, of FIG. 1. Alternatively, lines 40–42 and lines 60–62 may be connected to opposite ends of a communication link or to the input and output, respectively, of a data storage device. As with respect to lines 40–42, line 60 comprises the serialized codeword, line 61 represents the availability on line 60 of the codeword and line 62 represents acceptance and timing of the codeword by the decoder 51. Tables 52 and 53 are similar to table 16 in FIG. 1. The difference is that the table readout circuitry in FIG. 1 is loaded with either the table values associated with regular codewords or table values associated with special codewords, depending upon the significance of the signal on lines 12 and 22. In the decoder circuitry there is no prior indication as to whether the event is special or regular. Hence, both sets of tables must be supplied to the decoder for selection therebetween. The decoder tables are connected to decoder 51 by lines 70–73 and by cables 74–77. Lines 71 and 73 supply enabling signals to the decoder tables 52 and 53 to thereby load the table readout circuitry thereat. Lines 70 and 72 comprise pulses from the decoder 51 to operate the table readout circuitry. Cables 74–77 comprise the parallel output of the pre-established values selected from the tables 52 and 53. Decoder 51 selects the output from one of the sets of tables and combines these pre-established values with the codeword to provide the decoded output on cable 80 to event regenerator 50, together with a special or regular indication on line 81. The decoder is also connected to event regenerator 50 by means of lines 82 and 83. Line 82 comprises the signal indicating that the decoded information is supplied on cable 80 and line 81. Line 83 comprises an acceptance line from the event regenerator to indicate that it has accepted the information on cable 80 and line 81.

Initialization circuitry is also supplied and is operated by virtue of reset input 90 and start input 91. The reset input is connected to inputs 92 and 93 of the decoding and event regenerator circuitry and, via inverter 94 to AND circuit 95. AND circuit 95 insures that the start signal will be supplied subsequent to the reset signal to inputs 96 and 97 of the decoder and event regenerator.

The specific arrangement of decoder 51 and of decoder tables 52 and 53 will be explained hereinafter. An example of event regenerator 50 will also be explained hereinafter.

Referring now to a specific example of encoding circuitry 14 and encoder table 16, FIGS. 3 and 4–7 will be discussed.

Figure 3:
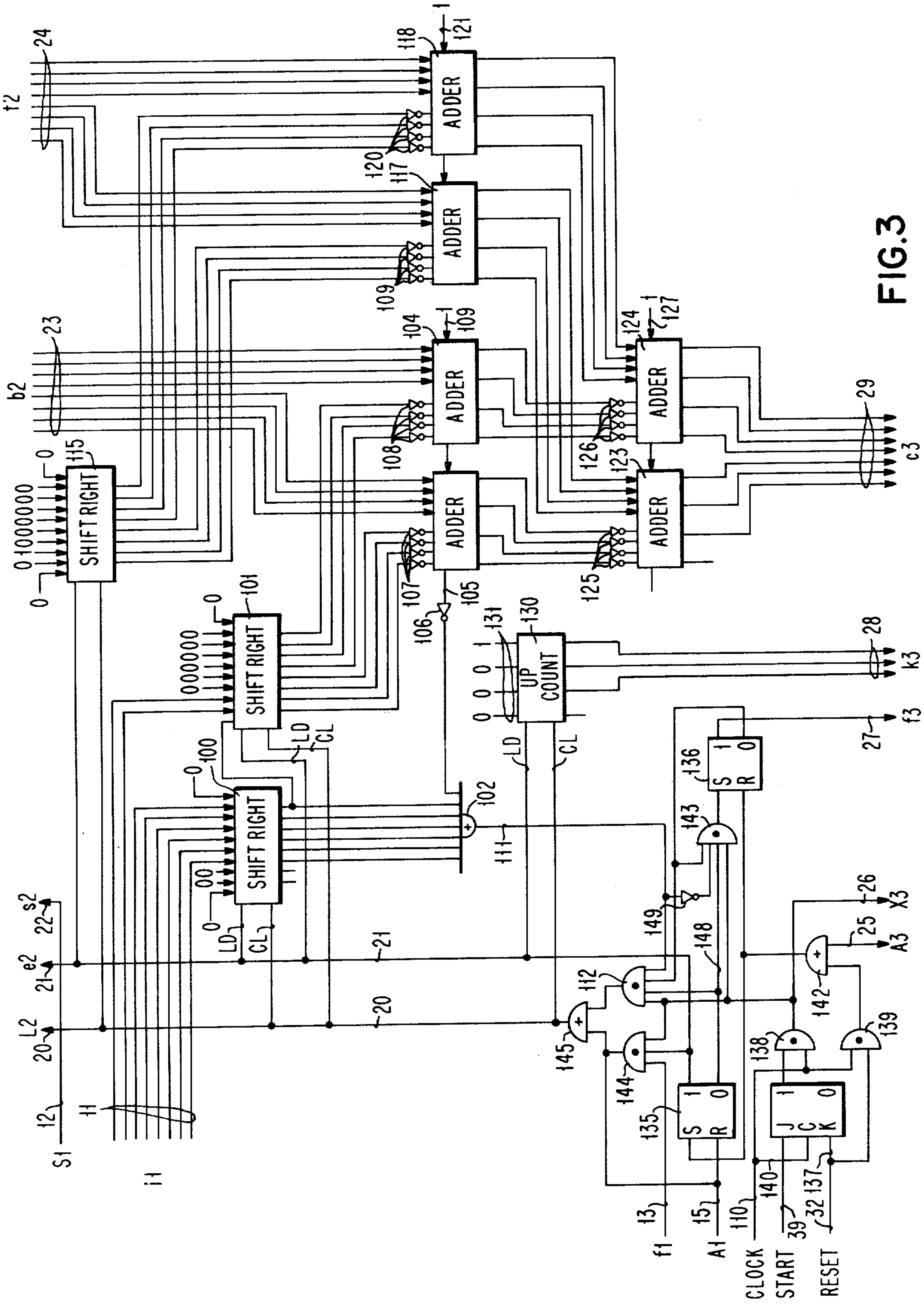
FIG. 3 is a detailed block diagram of one embodiment of encoder select/combine apparatus 14 of FIG. 1.

Referring first to FIG. 3, an implementation of encoder 14 is shown which employs standard semiconductor modular elements. Special input line 12 is connected directly to special output line 22 so that the line is employed directly to select the special or regular tabular values. The event designation cable 11 is connected to a shift register comprising shift-right units 100 and 101. These units are interconnected and are both connected to the same control lines 20 and 21 so as to comprise a single shift register arranged to shift only to the right. The contents of the shift register are directed to OR circuit 102 and to adders 103 and 104. The other input to the adders comprises cable 23 from the table readout circuitry. The carry output 105 from the adder circuitry is inverted by NOT circuit 106 and supplied to OR circuit 102. The inputs to the adder circuitry from shift register 100, 101 are first inverted by inverters 107, 108. The carry-in input 109 to the adder circuitry is supplied to a fixed voltage. The function of the resultant adder circuitry, inverters, and carry-in 109 is to subtract the binary value of the shift register 100, 101 from the binary value appearing on cable 23, and to provide an output from NOT circuit 106 to OR circuit 102 so long as the difference ($b-i$) is less than 0. The subtraction is accomplished by adders in accordance with the well-known binary relationship of adding the complement of the number to be subtracted to the number from which it is to be subtracted and adding a binary 1 thereto, together with inverting the carry output 105 of the adder to obtain the sign of the result.

As will be shown, the selection of the proper table values from the table readout circuitry is controlled by OR circuit 102. The table selection circuitry is of significantly lower cost than the random access type. Thus, clock pulses from clock 110 sequences the table readout circuitry, as will be explained hereinafter, under the control of the output of OR circuit 102 on line 111 at gate 112, until the table values corresponding to the event designation number supplied on cable 11 is reached.

An alternative to this unique circuit arrangement is a random access memory for holding the tabular values. In that situation, the event designation number on cable 11 would be employed to operate addressing circuitry to directly or indirectly address the corresponding memory location.

Other circuitry in FIG. 3 comprises a shift register 115 whose function is to shift a binary 1 initially loaded at input 116 in conjunction with shifts of shift register 100, 101. As the shift register is always loaded with the same values, the inputs thereto are fixed to the appropriate voltage levels. The contents of shift register 115 are supplied to adders 117 and 118 via inverters 119 and 120. The carry-in input 121 of adder 118 is affixed to suitable voltage level to generate a 1. The function of adder circuitry 117, 118 is therefore the same as adder circuitry 103, 104, namely to accomplish a subtraction of the input thereto of shift register 115 from the input thereto of cable 24.

Similarly, adder circuitry 123, 124 including inverters 125, 126 and carry-in input 127 operate to subtract the outputs of circuits 103, 104 from the outputs of circuits 117, 118. The net result is supplied on output cable 29. All of the subtracting circuitry comprising circuit 103, 104, circuit 117, 118, and circuit 123, 124 combine the tabular values from cables 23 and 24 with the value of the event designation number on cable 11 to generate a codeword on cable 29. Several shifting operations may be involved before the codeword appropriate for the event designation appearing on cable 11 and line 12 is developed on cable 29. The presence of the appropriate codeword is recognized by the absence of a signal from OR circuit 102 on line 111. The presence of a codeword on cable 29 is indicated to shift out circuit 17 by a signal on line 27, and the length of the codeword is designated by the contents of counter 130, which appears on cable 28. Since every codeword requires at least 1 bit, counter 130 is initially loaded with the binary value 0001, which is represented by inputs 131 thereto.

The operation of the circuitry of FIG. 3 is controlled by latches 135 and 136 and by clocked latch 138.

Upon latch 138 being in the reset state, the absence of a signal from the set output thereof disables AND circuit 141 to thereby block any clock pulses from AND circuits 112 and 144. The encoder 14 can therefore neither receive event designation numbers on cable 11 nor transfer code words on cable 29. Hence, when latch 138 is reset, encoder 14 is said to be in the "disabled" state.

Upon latch 138 being set, the signal from the set output thereof enables AND circuit 141 to transmit clock pulses from clock 110 to AND circuits 144, 112 and 143, and on line 26. The encoder is thus "enabled" and the operation of the encoder is determined by latches 135 and 136.

If latch 135 is set while latch 136 is reset, the circuitry of FIG. 3 is ready to receive the event designation from the event recognizer 10. If both latches 135 and 136 are reset, the circuitry of FIG. 3 is in the process of selecting the pre-established values from the table readout circuitry and combining those values with the event designation value. If latch 136 is set while 135 is reset, the selection and combination has been completed and a signal is provided on line 27 to indicate that the resultant codeword is ready for transfer to shift out circuitry 17. These three states of latches 135 and 136 are designated "ready to receive," "selecting" and "ready to transfer." The fourth state of these latches, in which both are set, cannot occur.

The function control circuitry of the apparatus of FIG. 3 will now be described. At the beginning of a day's operation, the circuitry must be initialized. First, a reset signal is supplied at input 32. This signal is supplied to input 137 of clocked latch 138 and to one input of AND circuit 139. Upon occurrence of the next clock pulse from clock 110 at input 140, latch 138 is reset. This prohibits any further outputs therefrom and thereby blocks gate 141. The reset signal is also applied to AND circuit 139 to gate the same clock pulse to OR circuit 142. OR circuit 142 then transmits the clock pulse to set latch 135, and to reset latch 136. The latches are therefore in the ready to receive state. Upon termination of the reset pulse, a start signal is supplied at input 39 to therefore set latch 138 upon occurrence of the next clock pulse from clock 110. Latch 138 thus operates AND circuit 141 to transmit subsequent clock pulses to line 26, to AND circuit 143, and to AND circuits 112 and 144. The encoder 14 is thus placed in operable condition to receive event designations from event recognizer 10.

An event designation comprises presence or lack of a special designation signal on line 12, the presence of an event designation number on cable 11, and the appearance of a signal at line 13. The signal on line 13 indicates that the event designation is present on line 12 and cable 11. Thus, when latches 135 and 136 are in the ready to receive state, so that the set output from latch 135 provides an enabling input to AND circuit 144, a signal on line 13 enables AND circuit 144 to thereby gate a clock pulse appearing from AND circuit 141 to OR circuit 145. The first clock pulse so enabled is supplied by AND circuit 144 to event recognizer 10 over line 15 to thereby indicate that the event designation is being accepted. That signal is also supplied to reset the latch 135, as will be explained. The clock pulse is additionally supplied on line 20 to the clock inputs of shift register 115 and shift register 100, 101, and to counter 130. The operational signal from latch 135 on line 21 is also supplied to the load inputs of the same circuits. These circuits are arranged such that the signals at the data inputs thereto will be loaded into the registers or counter upon the combination of the load signal and a clock pulse. Thus, the fixed inputs to shift register 115 are loaded, the event designation from cable 11 together with various fixed signals are loaded into shift register 100, 101, and the fixed count is loaded into counter 130. As will be explained, the combination of the signal on line 21 and the pulse on line 20 also operates the circuitry of encoded encoder 16 to load the table readout circuitry. Thus, initial outputs are received on cables 23 and 24 therefrom and supplied to the subtraction equivalency circuits 103, 104 and 117, 118. The outputs of these circuits are supplied to circuits 123, 124 which produces an output on cable 29.

As mentioned above, the clock pulse supplied by AND circuit 144 to event recognizer 10 over line 15, which is gated by a signal on line 13 when latches 135 and 136 are in the ready to receive state, that is when latch 135 is set and latch 136 is reset, also serves to reset latch 135. This, together with the reset condition of latch 136, designates the selecting state.

When latches 135 and 136 are in the selecting state, the reset outputs from these two latches provide enabling inputs to AND circuits 112 and 143. So long as OR circuit 102 generates a positive signal, which indicates that the outputs on cable 29 do not represent the codeword for the previously received event designation, line 111 provides an enabling input to AND circuit 112 and inverter 149 disables AND circuit 143. In such cases, a clock pulse appearing from AND circuit 141 is gated through AND circuit 112 and OR circuit 145 to line 20. This clock pulse, together with the absence of a signal from the reset output of latch 135, causes counter 130 to be incremented, causes shift register 100, 101 to be shifted right by one position, causes shift register 115 to be shifted right by one position, and as will be explained, causes the table readout circuitry to alter the outputs on cables 23 and 24. The resulting contents of shift circuitry 100, 101 and 115, together with the new values on cables 23 and 24, supply new inputs to subtraction equivalency circuits 103, 104 and 117, 118, and the outputs from these circuits provide new inputs to circuits 123, 124, which in turn generate new outputs on cable 29. Additionally, the altered contents of shift register 100 and the new carry from adder 107, which is inverted by inverter 106, provide new inputs to OR circuit 102.

When latches 135 and 136 are in the selecting state, so that the reset outputs from both latches provide enabling inputs to AND circuits 112 and 143, the absence of a positive signal from OR circuit 102 disables AND circuit 112 and causes inverter 149 to enable gate 143. In such cases a clock pulse from AND circuit 141 sets latch 136. This, together with the reset condition of latch 135, designates the ready to transfer state.

When latches 135 and 136 are in the ready to transfer state, so that latch 135 is reset and latch 136 is set, the set output from latch 136 provides a signal on line 27 to shift out circuit 17. Shift out circuit 17 answers the signal on line 17 by supplying an accept pulse on line 25. This pulse is transmitted by OR circuit 142 to set latch 135 and reset latch 136, thereby returning these latches to the ready to receive state.

Figure 4:
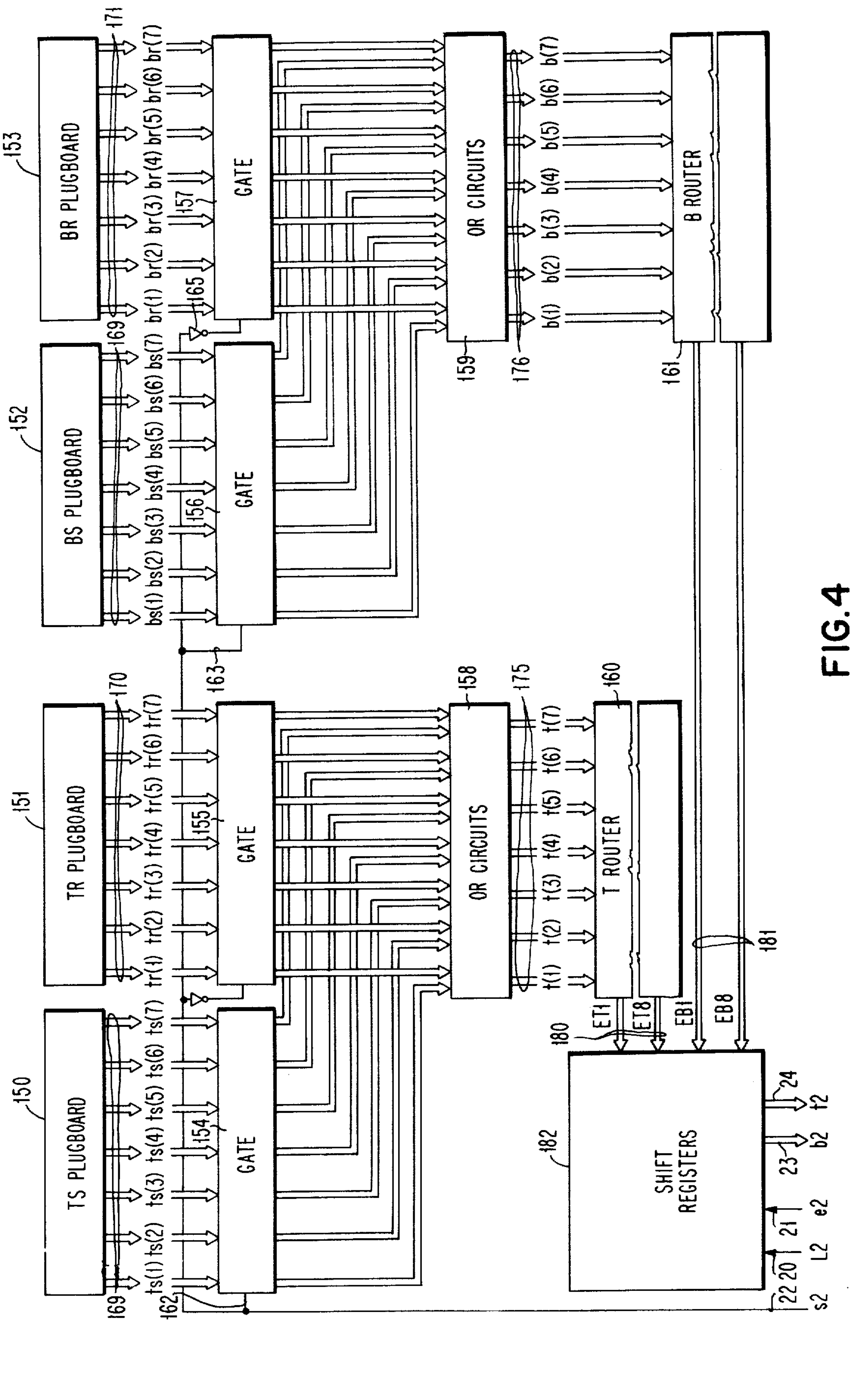
FIG. 4 is a more detailed block diagram of an embodiment of encoder tables 16 of FIG. 1.

Encoder tables 16 of FIG. 1 are illustrated in detail in FIG. 4.

The encoder tables include a series of plugboards 150–153, the outputs of which are selectively gated by gating circuits 154–157 and OR circuits 158 and 159 to matrix routers 160 and 161. The plugboards 150–153 comprise standard commercially available plugboards which may be wired in accordance with a desired code. An example of such a code will be illustrated hereinafter. Plugboards 150 and 152 represent the pre-established values to be selected for special events. Plugboards 151 and 153 comprise the pre-established values to be selected for regular events.

Special event line 22 is supplied directly to inputs 162 and 163 of gate circuits 154 and 156. It is also supplied via inverters 164 and 165 to inputs 166 and 167 of AND gates 155 and 157. Thus, upon the appearance of a special event indicator signal on line 22, AND gates 154 and 156 are operated to supply the outputs 168 and 169 of plugboards 150 and 152 to OR circuits 158 and 159. Inverters 164 and 165 invert the special input signal to block gates 155 and 157 from supplying outputs 170 and 171 from plugboards 151 and 153 to OR circuits 158 and 159. Similarly, when the event is recognized as regular instead of special, the lack of a signal on line 22 blocks gates 154 and 156 and is inverted by inverters 164 and 165 to operate gates 155 and 157 to transmit the information at the outputs of plugboards 151 and 153 to the OR circuits 158 and 159.

The OR circuits transmit all information gated thereto over the corresponding outputs 175 and 176 to the respective matrix router 160 or 161. The routers then supply the signals over the respective output lines 180 or 181 to shift registers 182. Finally, these signals on lines 180 and 181 are loaded into shift registers 182 in response to a pulse on line 20 in conjunction with a load signal on line 21. Shift register 182 are then operated by pulses on line 20, and the absence of a load signal on line 21, to sequence through the loaded pre-established table values until the values on cables 23 and 24 are those corresponding to the event designation to be encoded. Thus, the gate and OR circuits are employed to select the proper set of plugboards and the routers are employed to arrange the outputs of the plugboards in the proper sequence for selection by the encoder 14 through cables 23 and 24 in response to shift pulses on line 20 to shift registers 182.

Figure 5:
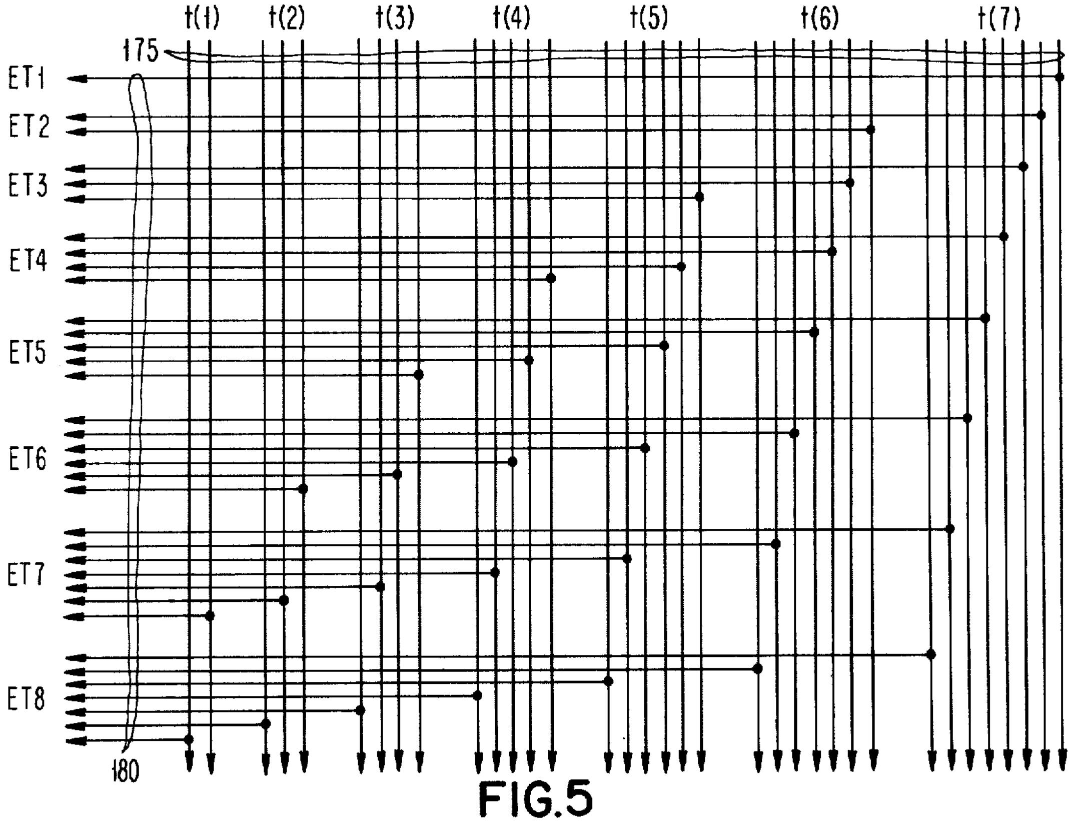
FIG. 5 is a detailed diagram of a T router 160 of FIG. 4.
Figure 6:
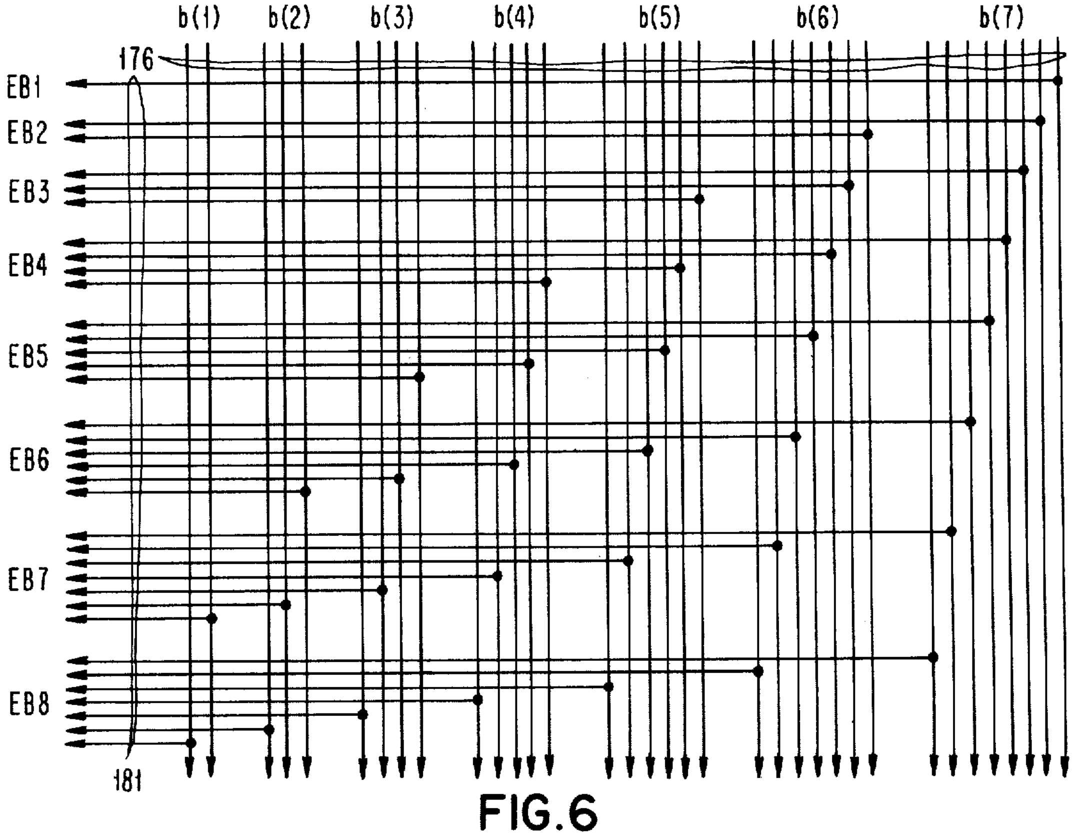
FIG. 6 is a detailed diagram of a B router 161 of FIG. 4.

Routers 160 and 161 are shown respectively in FIGS. 5 and 6. The routers illustrated comprise simply a matrix connection between the output lines 175 and 176 of OR circuits 158 and 159 to the inputs 180 and 181 of shift registers 182. Using router 161 in FIG. 5 as an example, the 8th bit of input $t(7)$, counting from the left, becomes output ET1. The 7th bit in each of $t(6)$ and $t(7)$, again counting from the left, becomes outputs ET2. The number of lines represented by ET3, ET4, ET5, ET6 and ET7 are seen to increase by one until ET7 is reached. ET7 thus includes seven lines. ET8 also has seven lines, which are the high order bit position of each of the plugboard outputs, $t(1)$ through $t(7)$. The router of FIG. 6 is arranged in the identical manner to that of FIG. 5.

Figure 7:
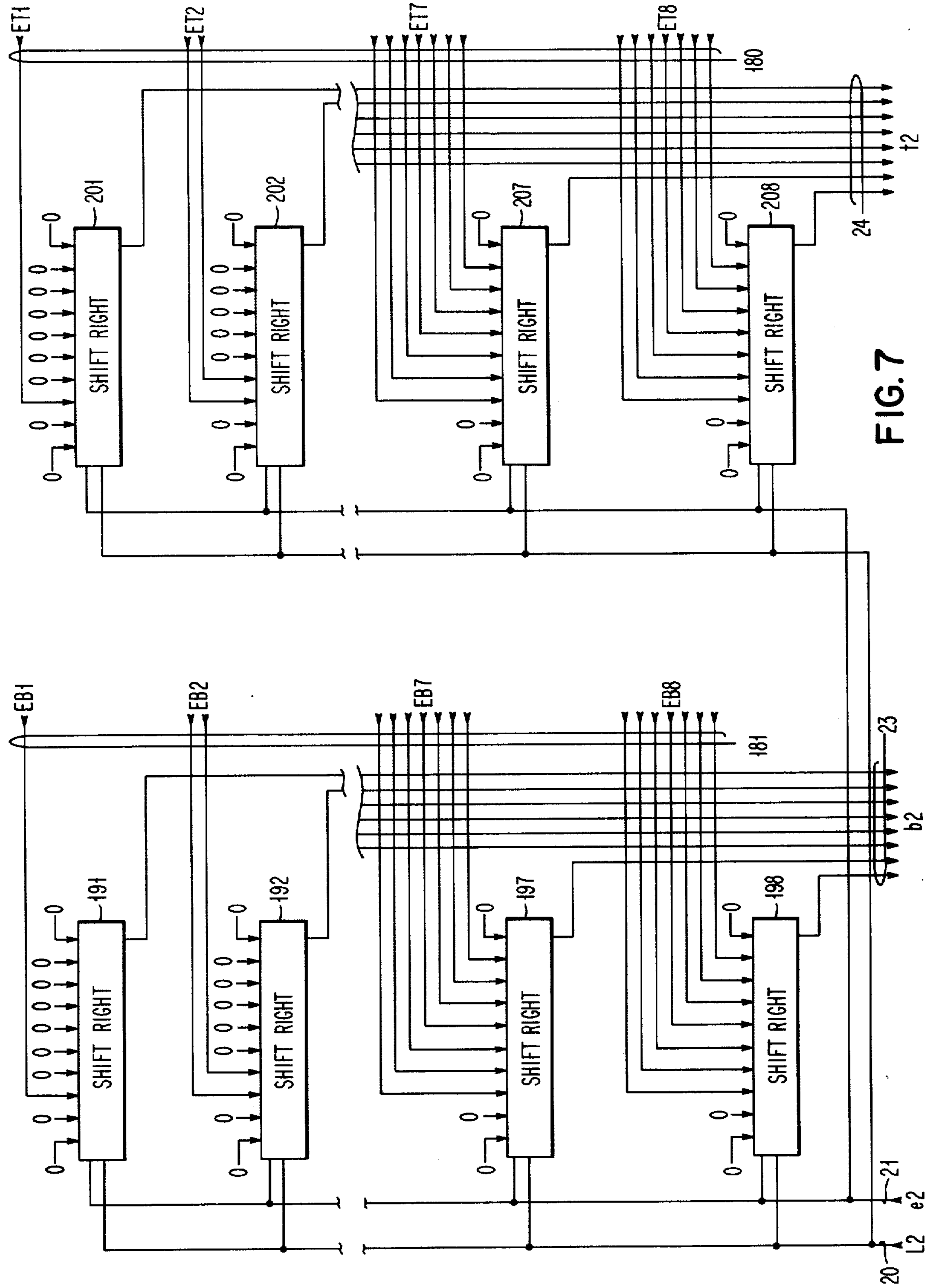
FIG. 7 is a detailed block diagram of shift registers 182 of FIG. 4.

Referring now to FIG. 7, the various shift registers are illustrated. The router outputs as contained in cable 181 and comprising outputs EB1 through EB8 from router 176 are connected to shift registers 191 through 198 respectively. Similarly, the router outputs comprising cable 180 and comprising individual outputs ET1 through ET8 from router 175 are connected to the shift registers 201 through 208, respectively. The shift registers are all arranged so that the combination of the signal on line 21 accompanied by a clock pulse on line 20 loads the shift registers with the information comprising cables 181 and 180. Certain load input positions of each shift register are designated as 0 and are connected to an appropriate permanent voltage to designate the binary 0. An example is connecting these inputs to ground. The combination of the signal on line 21 with the clock pulse on line 20 similarly loads the zero inputs into the shift registers. As is seen, the rightmost bit from each of shift registers 191–198 are provided on cable 23 and the rightmost bits of shift registers 201–208 are supplied on cable 24.

Should OR circuit 102 in FIG. 3 indicate by a signal on line 111 that the pre-established values corresponding to the event designation are not yet present on cables 23 and 24, the signal on line 111 gates a clock pulse from clock 110, via AND circuit 112 and OR circuit 145 to line 20. The clock pulse, accompanied by the absence of a signal on line 21, operates all of the shift registers 191–198 and 201–208, causing them to shift 1 bit to the right. Thus, a new set of data is supplied from the shift registers on cables 23 and 24. The shifting continues until such time as OR circuit 102 in FIG. 3 indicates that the pre-established values corresponding to the event designation have been selected.

Figures 8, 10:
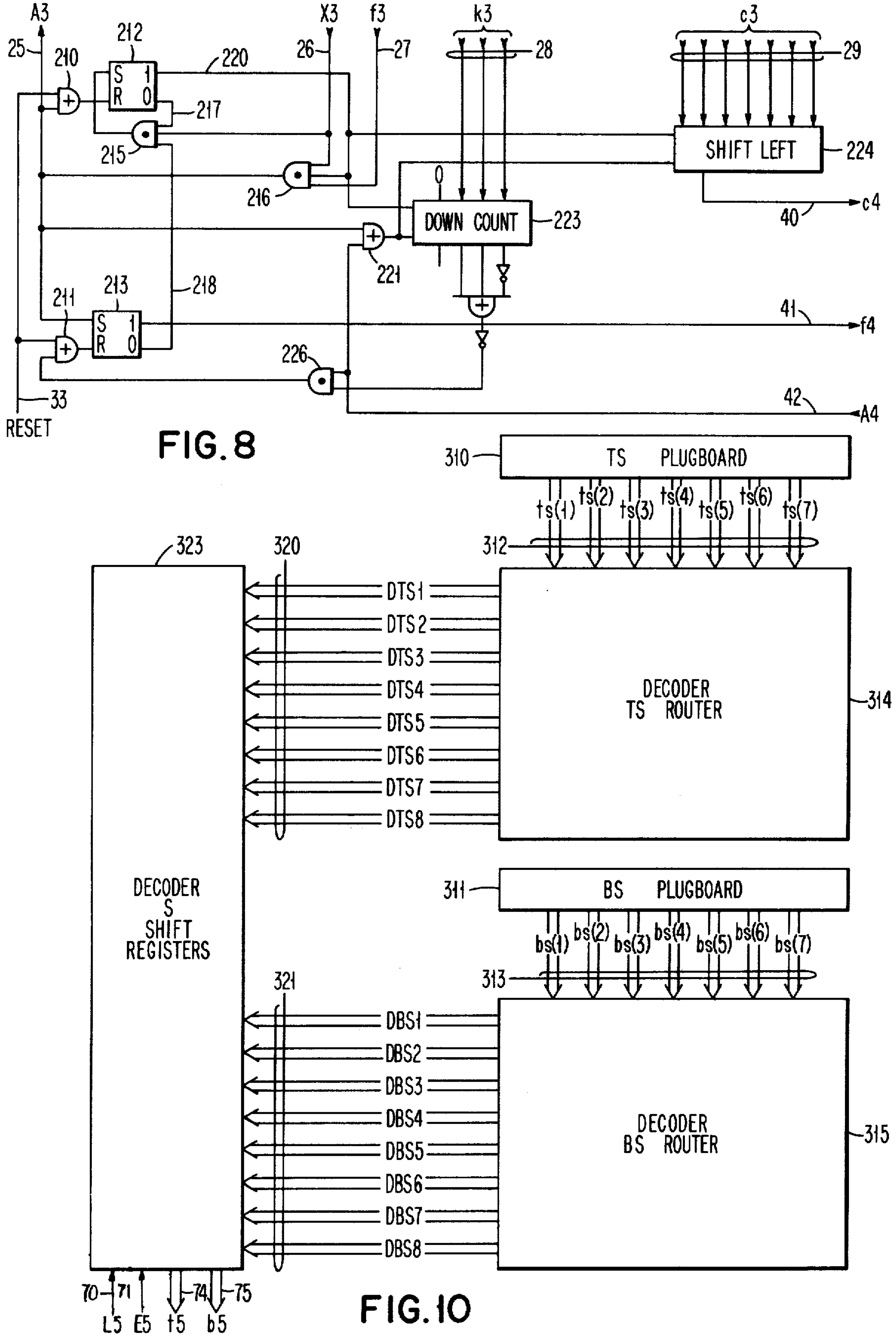
FIG. 8 is a detailed block diagram of an embodiment of shift out circuitry 17 of FIG. 1.
FIG. 10 is a more detailed block diagram of an embodiment of the decoder S tables 52 of FIG. 2.

FIG. 8 illustrates the shiftout circuitry 17 in greater detail. As will be explained, the codeword on cable 29 and the corresponding codeword length on cable 28 are loaded into shift register 224 and counter 223, respectively, in response to a clock pulse transmitted on line 26. Subsequently, as will be explained, clock pulses appearing on line 42 cause shift register 224 to be shifted left so that successive bits of the codeword become available on line 40. The clock pulses on line 42 also serve to decrement counter 223, which is used to indicate when the entire codeword has been transmitted over line 40.

The operation of the shiftout circuitry 17 in FIG. 8 is controlled by latches 212 and 213, in much the same way that latches 135 and 136 control the operation of the encoder in FIG. 3. If latch 212 is set and latch 213 is reset, then shift out circuit 17 is ready to receive a codeword and the corresponding codeword length from encoder 14 on cables 29 and 28, respectively. If latch 212 is reset and latch 213 is set, then shift out circuit 17 is either ready to transmit the codeword or is in the process of serial transmission of the codeword over line 40. These two states of latches 212 and 213 are called the ready to receive and the ready to transmit states, respectively. Since the clock pulses appearing on lines 26 and 42 may well be derived from different clocks, timing considerations require a third state for latches 212 and 213, called the "transitional" state, in which both latches are reset. The latches are never simultaneously set.

Reset input line 33 to shift out circuit 17 is connected to the reset input 30 of FIG. 1 and is connected, via OR circuits 210 and 211, to latches 212 and 213. Thus, a reset signal serves to reset both latch 212 and 213, thereby placing the circuit in the transitional state.

When latches 212 and 213 are in the transitional state, so that both latches are reset, the reset output of latch 212 on line 217 and the reset output of latch 213 on line 218 serve as enabling inputs to AND circuit 215. Also, the absence of a signal from the set output from latch 212 on line 220 serves to disable AND circuit 216. Thus, when latches 212 and 213 are in the transitional state, a clock pulse appearing from encoder 14 on line 26 is transmitted via AND circuit 215 to set latch 212, thereby placing latches 212 and 213 in the ready to receive state.

When latches 212 and 213 are in the ready to receive state, so that latch 212 is set and latch 213 is reset, the set output from latch 212 on line 220 provides an enabling input to AND circuit 216, while the absence of a signal from the reset output of latch 212 on line 217 serves to disable AND circuit 215. Additionally, the signal on line 220 provides a load enable input to counter 223 and shift register 224.

Encoder 14 indicates that a codeword and the corresponding codeword length are available on cables 29 and 28, respectively, by supplying a signal on line 27. This signal serves as an enabling input to AND circuit 216 in FIG. 8. If latches 212 and 213 are in the ready to receive state, so that the set output of latch 212 on line 220 provides an enabling input to AND circuit 216, then the clock pulse from encoder 14 on line 26 immediately following the appearance of a signal on line 27 is gated by AND circuit 216 to OR circuit 221, and thereby to counter 223 and shift register 224. This signal operates in conjunction with the set output from latch 212 on line 220 to load the information on cables 28 and 29 into counter 223 and shift register 224, respectively. The clock signal gated by AND circuit 216 is additionally supplied on line 25 to encoder 14 to thereby indicate that the information on cables 28 and 29 has been accepted and loaded into counter 223 and shift register 224. Lastly, the clock signal gated by AND circuit 216 serves to set latch 213 and is transmitted via OR circuit 210 to reset latch 212, thereby placing the latches in the ready to transmit state.

When latches 212 and 213 are in the ready to transmit state, so that latch 212 is reset and latch 213 is set, the absence of a signal from the set output of latch 212 on line 220 serves to disable AND circuit 216 and the absence of a signal from the reset output of latch 213 on line 218 disables AND circuit 215. Also, the absence of a signal on line 220 serves as a count enable input to counter 223 and a shift enable input to shift register 224. The set output of latch 213 supplies a signal on line 41 to the transmission link, data storage device, or decoder 51 in FIG. 2, which responds by supplying clock pulses on line 42. These clock pulses are transmitted via OR circuit 221 to decrement counter 223 by one and to shift the contents of shift register 224 to the left by 1 bit position. The clock pulses are also transmitted to AND circuit 228, which is disabled by OR circuit 226 until the contents of counter 223 is reduced to 001. When the contents of counter 223 is reduced to 001, which indicates that only 1 bit of the codeword in shift register 224 remains to be transmitted on line 40, a clock pulse on line 42 is gated by AND circuit 228 and OR circuit 221 to reset latch 212, thereby returning latches 212 and 213 to the "transmit" state.

Referring now to a specific example of decoding circuitry 51 and decoder special tables 52 and decoder regular tables 53, FIGS. 9 through 17 will be discussed.

Figure 9:
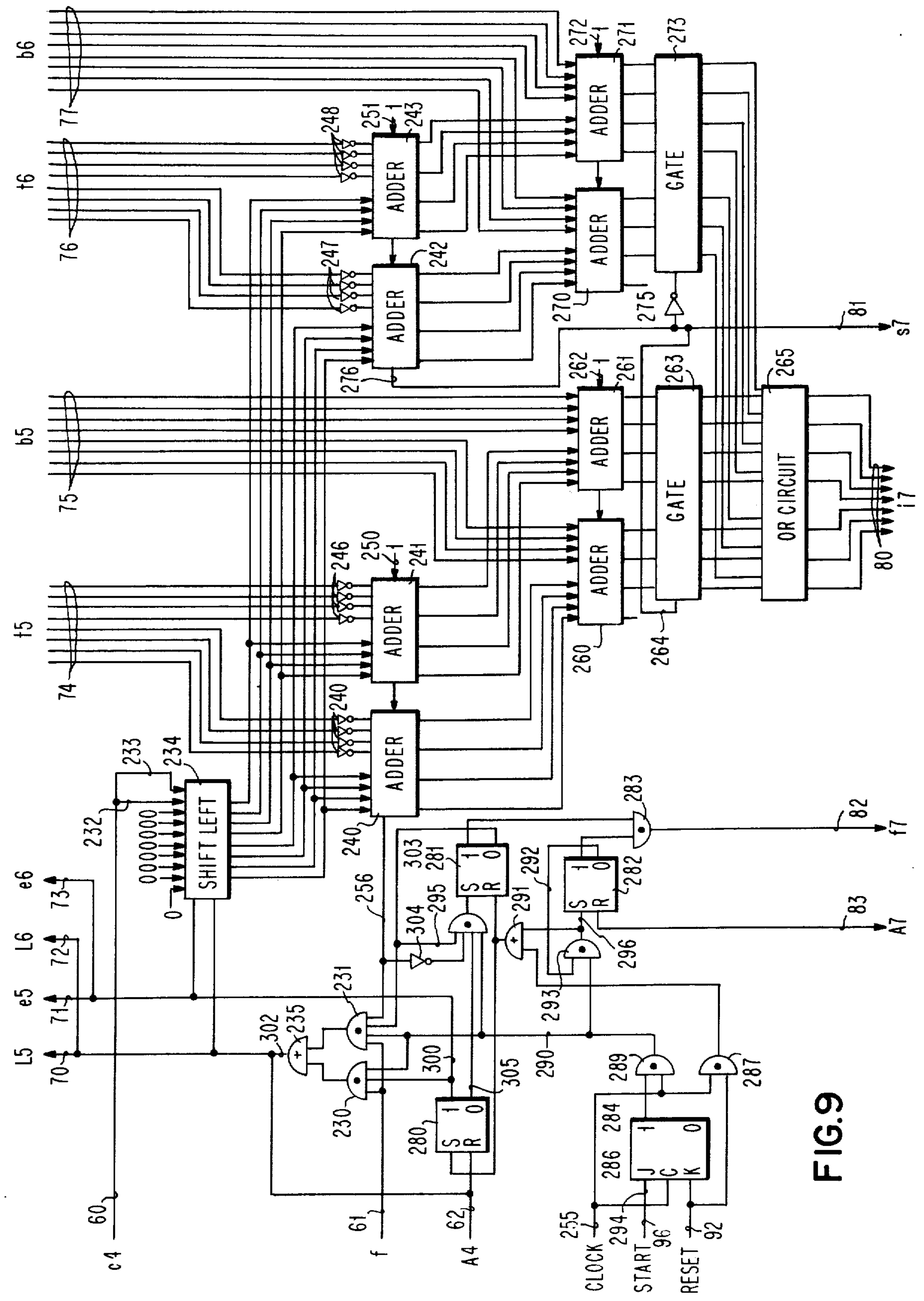
FIG. 9 is a detailed block diagram of an embodiment of the decoder select/combine apparatus 51 of FIG. 2.

Referring first to FIG. 9, an implementation of encoder 51 is shown which employs standard semiconductor modular elements. Input line 61 is connected to AND circuits 230 and 231. A signal is present on line 61 so long as serial data is supplied therewith on line 60 to inputs 232 and 233 of shift left register 234. When the initial bit of the serial data appears on line 60, shift left register 234 loads that bit from line 232 into the rightmost bit position of the register, as will be explained. The remaining bit positions of the register are loaded with zeroes from permanently affixed voltages at the inputs thereto. For all subsequent bits of the codeword, shift left register 234 shifts to the left and shifts in the successive bits on line 60 via shift-in input 233. Acceptance output pulses are supplied on line 62 from OR circuit 235.

The contents of shift left register 234 are supplied to adders 240 and 241 and to adders 242 and 243. The other input to adders 240 and 241 comprises cable 74 from decoder special tables 52, after first being inverted by inverters 245, 246. The other inputs to adder 242, 243 comprise cable 76 from decoder regular tables 53 and are supplied via inverters 247, 248. The carry-in input 250 to adder 240, 241 and the carry-in input 251 to adder circuitry 242, 243 are each supplied from a fixed voltage representing a binary 1. As with respect to similar adder circuitry in FIG. 3, the function of this resultant adder circuitry, inverters, and carry-in is to subtract the binary value supplied to the inverted inputs from the binary value supplied to the regular inputs. As with respect to the adders in FIG. 3, the subtraction is accomplished by the adders in accordance with a well-known binary relationship of adding the complement of the number to be subtracted to the number from which it is to be subtracted, and adding a binary 1 thereto.

The selection of the proper table values from the table readout circuitry thereof is controlled by AND circuit 231. The table readout and selection circuitry is of significantly lower cost than the random access type as it is of the sequential access type. Thus, clock pulses from a clock 255 sequences the table readout circuitry, as will be explained hereinafter, via the control of the output of AND circuit 231 under the more direct control of the output of subtractor 240, 241 on line 256, until the table values corresponding to the codeword supplied on input 60 is reached.

The output of subtraction unit 240, 241 is supplied to adders 260 and 261. Circuits 260 and 261 function as adders, with the fixed voltage representing a binary 1 at carry-in input 262 thereto. The adders thus add the result of the subtraction at subtraction equivalency unit 240, 241 to the output from decoder special tables 52 on cable 75 and additionally add to that sum the binary 1 from line 262. The output of the adders is supplied to gate circuit 263. Thus, upon the appearance of a positive signal on line 264, the output of adders 260 and 261 is gated thereby to OR circuits 265.

Similarly, the output of subtraction unit 242, 243 is supplied to adder circuits 270 and 271. Another input to the adder circuits comprises the output from decoder regular tables 53 on cable 77. The carry-in input 272 to the adder circuit is connected to a fixed voltage representing a binary 1. Thus, the addition function of adders 270 and 271 is identical to the function of adders 260 and 261 with the exception that they are operating with respect to the values from the decoder regular tables 53 as opposed to the decoder special tables 52 for adder circuits 260, 261.

The output of adders 270, 271 is supplied to gate circuit 273. The gating input 274 thereto is connected to inverter 275. Thus, the carry output signal on line 276 from the subtraction unit 242, 243 operates gate circuit 263 when the signal is positive and, via inverter 275, operates gate circuit 273 when the signal is negative. The outputs of gate circuits 263 and 273 are supplied to the inputs of OR circuits 265, and the resultant output signal therefrom comprises the event designation number on cable 80. The carry output signal on line 276 from subtraction circuitry 242, 243 comprises the special or regular event designation signal and is supplied additionally on line 81.

The operation of decoder 51 in FIG. 9 is controlled by clocked latch 286 and by latches 280 and 281 in much the same way that latches 140, 135 and 136 control the operation of encoder 14 in FIG. 3. If latch 386 is reset, then the absence of a signal from the set output therefrom on line 284 disables AND circuit 289, so that no clock pulses are available on line 290. In this case decoder 51 can neither receive code words on line 60 nor transfer event designations on cable 80 and line 81. Hence, when latch 286 is reset, decoder 51 is said to be in the "disabled" state.

On the other hand, if latch 386 is set, then the signal on line 284 enables AND circuit 289 to transmit clock pulses to line 290. In this case the operation of decoder 51 is determined by latches 280 and 281. If latch 280 is set and latch 281 reset, decoder 51 is ready to receive the first bit of a codeword on line 60. If latches 280 and 281 are both reset, decoder 51 is in the process of receiving a codeword on line 60 and combining this codeword with table values appearing on cables 74–77 to determine an event designation for cable 80 and line 81. If latch 280 is reset and latch 281 is set, then a codeword has been decoded, and the resulting event designation on cable 80 and line 81 is ready to be transferred to event regenerator 50. These three possibilities, occurring in conjunction with the set condition of latch 286, determine the ready to receive, "combining" and "ready to transfer" states, respectively, for decoder 51.

At the beginning of a day's operation, decoder 51 in FIG. 9 is initialized by a reset signal on line 92 followed by a start signal on line 96. As will be shown, this sequence of two signals places decoder 51 in the ready to receive state. First, the reset signal on line 92 is supplied to input 285 of latch 286 and to one input of AND circuit 287. The next clock pulse from clock 255 on line 288 serves to reset latch 286, thereby placing decoder 51 in the disabled state. This same clock pulse is also gated by AND circuit 287 via OR circuit 291 to set latch 280 and to reset latch 281. Second, the start signal on line 96 is supplied to input 294 of latch 286, so that the next clock pulse from clock 255 on line 288 serves to set latch 286. The resulting set condition for latches 286 and 280, together with the reset condition for latches 286 and 280, together with the reset condition of latch 281, constitute the ready to receive state for decoder 51.

Upon decoder 51 being in the ready to receive state, latches 286 and 281 are set while latch 281 is reset. Then the set output of latch 286 on line 284 gates clock pulses from clock 255 onto line 290 via AND circuit 289. Also, the set output of latch 280 on line 300 provides an enabling input to AND circuit 230 and serves as a load enable input to shift register 234, while the absence of a reset output from latch 280 on line 305 serves to disable AND circuit 295. The signal on line 300 is additionally transmitted via line 71 to decoder special tables 52 and via line 73 to decoder regular tables 53. So long as no signal is present on line 61, AND circuits 230 and 231 are disabled and decoder 51 remains in the ready to receive state. However, when a signal appears on line 61, which indicates that the first bit of a codeword is available on line 60, a clock pulse appearing on line 290 is gated via AND circuit 230 and OR circuit 235 to line 302. This clock pulse on line 302, in conjunction with the signal on line 300, serves to load the codeword bit appearing on line 60 into the rightmost bit position of shift register 234, via load input 232. Simultaneously, the remaining positions of shift register 234 are loaded with zeroes from permanently affixed inputs. As will be described, the combination of a clock pulse on line 302 and a signal on line 300, which is conveyed to decoder special tables 52 and decoder regular tables 53 via lines 70–73, causes table shiftout circuitry to be loaded, so that table values are presented on cables 74–77. The clock pulse on line 302 is additionally transmitted via line 62 to acknowledge acceptance of the first bit of a codeword. And finally, the clock pulse on line 302 serves to reset latch 280, thereby placing decoder 51 in the combining state.

Upon decoder 51 being in the combining state, latch 286 is set and latches 280 and 281 are reset. Then the set output of latch 286 on line 284 gates clock pulses from clock 255 onto line 290 via AND circuit 289. Also, the reset output from latch 281 on line 302 provides an enabling input to AND circuits 231 and 295, the reset output of latch 280 on line 305 provides an enabling input to AND circuit 295 and the lack of a set output from latch 280 on line 300 serves to disable AND circuit 230. In the manner previously described, the contents of shift register 234 are combined with table values appearing on cables 74–77 to yield outputs on cable 80 and line 81. These outputs on cable 80 and line 81 constitute an event designation only if the table value appearing on cable 74 exceeds the value in shift register 234, so that the carry output from subtraction equivalency circuit 240, 241 is zero. In this case, the absence of a signal on line 256 serves to disable AND circuit 231, and inverter 304 provides an enabling input to AND circuit 295, so that a clock pulse appearing on line 290 is gated via AND circuit 295 to reset latch 281. This places decoder 51 in the ready to transfer state.

On the other hand, if decoder 51 is in the combining state, the presence of a signal on line 256 indicates that the outputs on cable 80 and line 81 do not constitute an event designation. This means that register 234 does not contain a complete codeword, and that additional codeword bits must be input via line 60. In this case the signal on line 256 provides an enabling input to AND circuit 231 and, in conjunction with inverter 304, serves to disable AND circuit 295. So long as no signal is present on line 61, AND circuit 231 is disabled and decoder 51 remains in the combining state. However, when a signal appears on line 61, which indicates that the next codeword bit is available on line 60, a clock pulse appearing on line 290 is gated via AND circuit 231 and OR circuit 235 to line 302. This clock pulse on line 302, together with the absence of a set output from latch 280 on line 300, causes shift register 234 to shift left one bit position, shifting the codeword bit appearing on line 60 into the rightmost bit position via shift input 233. As will be described, the combination of a clock pulse on line 302 and the absence of a signal on line 300, which is conveyed to decoder special tables 52 and decoder regular tables 53 via lines 70–73, causes new table values to be presented on cables 74–77. The clock pulse on line 302 is additionally transmitted via line 62 to acknowledge acceptance of the codeword bit. This clock pulse on line 302 also provides a reset input to latch 280, so that decoder 51 remains in the combining state.

Upon decoder 51 being changed to the ready to transfer state, latches 286 and 281 are set while latch 280 is reset. Then the set output of latch 286 on line 284 gates clock pulses from clock 255 onto line 290 via AND circuit 289. If latch 282 is set, then the set outputs from latches 281 and 282 cause AND circuit 285 to provide a signal on line 82, which is transmitted to event regenerator 50. The signal on line 82 indicates the presence of an event designation on cable 80 and line 81. Acceptance of this event designation by event regenerator 50 is acknowledged by a pulse on line 83, which serves to reset latch 282. When decoder 51 is in the ready to transfer state and latch 282 is reset, the reset output of latch 282 provides an enabling input to AND circuit 293. In this case, a clock pulse appearing on line 290 is gated through AND circuit 293 onto line 296. The clock pulse on line 296 serves reset latch 282, and this clock pulse is also transmitted via OR circuit 291 to set latch 280 and to reset latch 281, thereby placing decoder 51 in the ready to receive state.

Reference will now be made to FIGS. 10–17 for descriptions of the decoder tables 52 and 53 of FIG. 2.

Figures 14, 18:
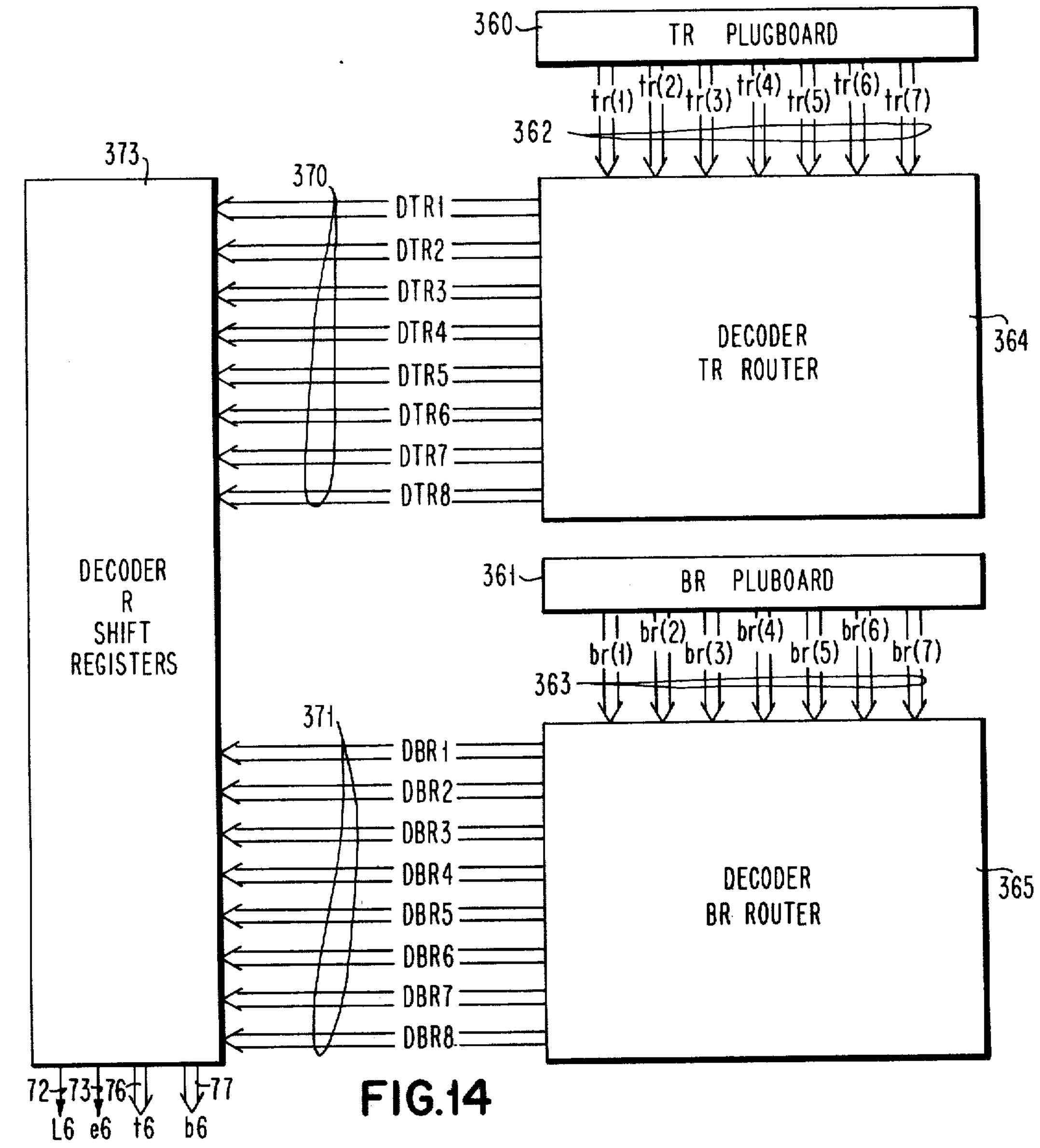
FIG. 14 is a more detailed block diagram of an embodiment of decoder R tables 53 of FIG. 2.
FIG. 18 is an illustration of the outputs of the encoder tables 16 of FIG. 1 and of the decoder tables 52 and 53 of FIG. 2.

FIGS. 10 and 14 illustrate each of the elements of the special tables and regular tables, respectively, in block diagram form. The decoder tables include a set of plugboards 310 and 311 in FIG. 10 and 360 and 361 in FIG. 14. The outputs 312 and 313 in FIG. 10 and 362 and 363 in FIG. 14 are supplied directly to the appropriate matrix routers 314, 315 and 364, 365, respectively. The plugboards 310, 311 and 360, 361 comprise standard commercially available plugboards which may be wired in accordance with a desired code, which must correspond with the code of the encoder. Indeed, plugboards 310, 311, 360 and 361 may be the same plugboards 150, 152, 151, 153 used by the encoder tables 16 as shown in FIG. 4.

Plugboards 310 and 311 represent the pre-established values for special event codewords. Plugboards 360 and 361 represent the pre-established values selected for regular event codewords. The matrix routers 314, 315 in FIG. 10 and 364, 365 in FIG. 14 route the signals from the plugboards over the respective output lines 320, 321 and 370, 371 to shift registers 323 and 373. The shift registers are then operated by the pulses on lines 70 and 72 in the presence of signals on lines 71 and 73 to load the output signals of the associated plugboards, and operated by pulses on line 70 and on line 72 in the absence of signals on lines 71 and 73 to sequence through the loaded signals until the pre-established values on cables 74–77 are those corresponding to the received codeword. The matrix routers are employed in this operation to arrange the outputs of the plugboards in the proper sequence for selection by the decoder 51 through the supply of pulses on lines 70 and 72 to shift registers 323 and 373.

Figure 11:
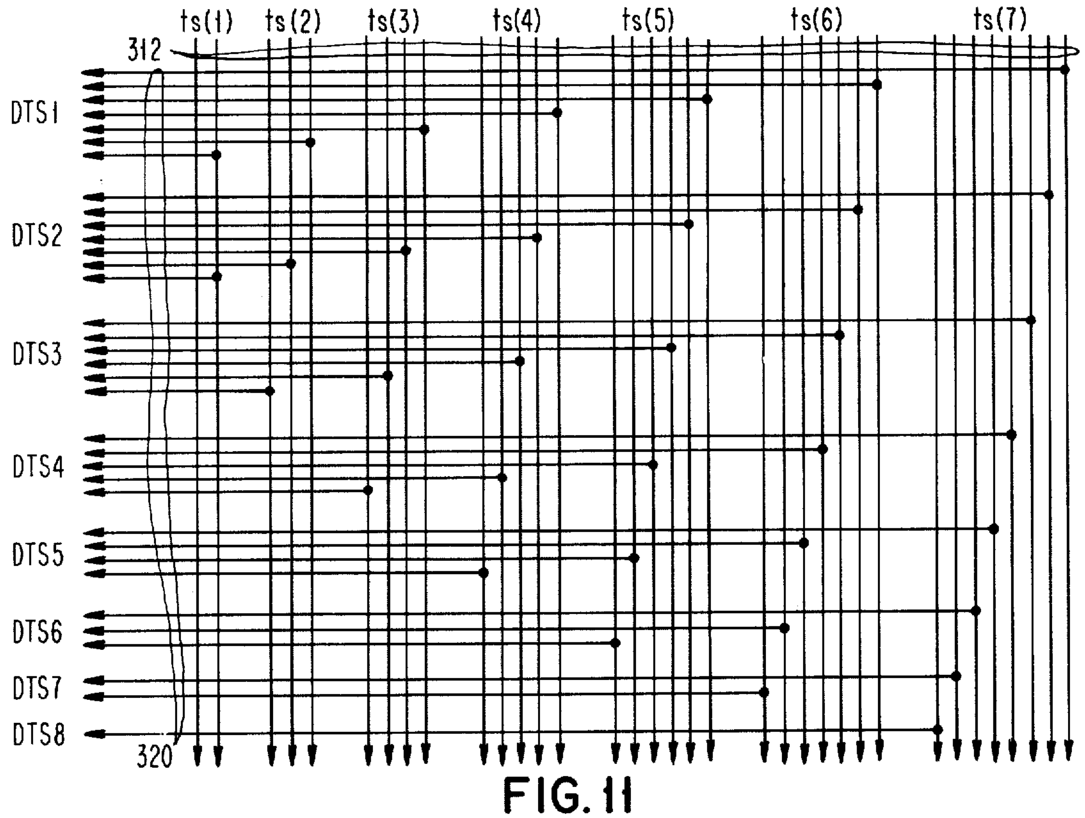
FIG. 11 is a detailed diagram of the Ts router 314 of FIG. 10.
Figure 12:
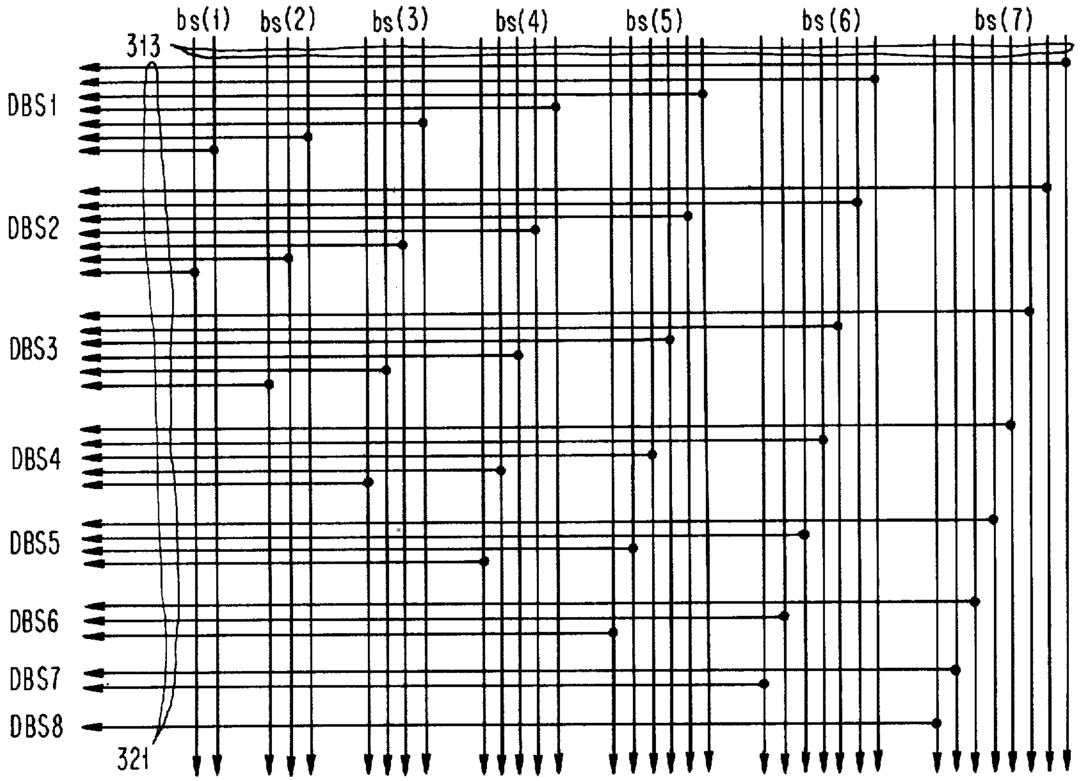
FIG. 12 is a detailed diagram of the BS router 315 of FIG. 10.

Matrix routers 314 and 315 are shown, respectively, in FIGS. 11 and 12. Matrix routers 364 and 365 are shown, respectively, in FIGS. 15 and 16. The routers illustrated comprise simply a matrix connection between the plugboard output lines and the inputs of the corresponding shift registers. Specifically, matrix router 314 of FIG. 11 connects the output lines 312 from TS plugboard 310 to lines 320 of shift registers 323. Matrix router 315 of FIG. 12 connects the output lines 313 of plugboard 311 to inputs 321 of shift registers 323. Matrix router 364 of FIG. 15 connects output lines 362 of plugboard 360 to inputs 370 of shift registers 373. Matrix router 365 of FIG. 16 connects the output lines 363 of plugboard 361 to inputs 371 of shift registers 373.

Figure 15:
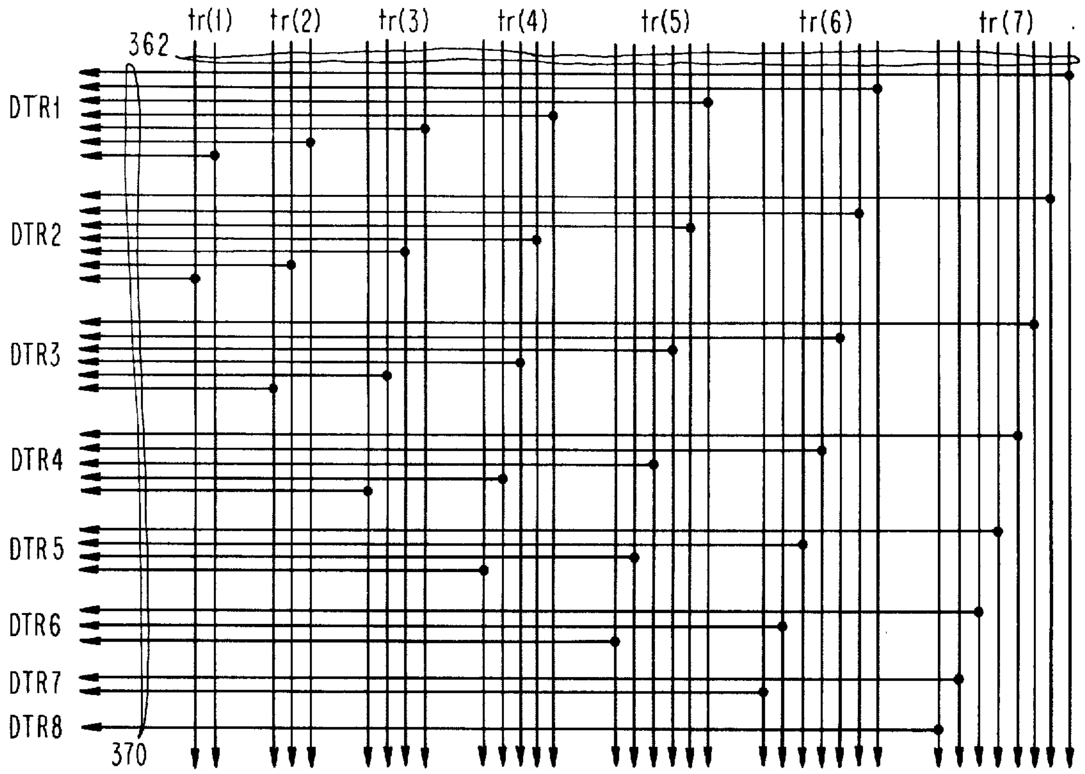
FIG. 15 is a detailed diagram of the TR router 364 of FIG. 14.
Figure 16:
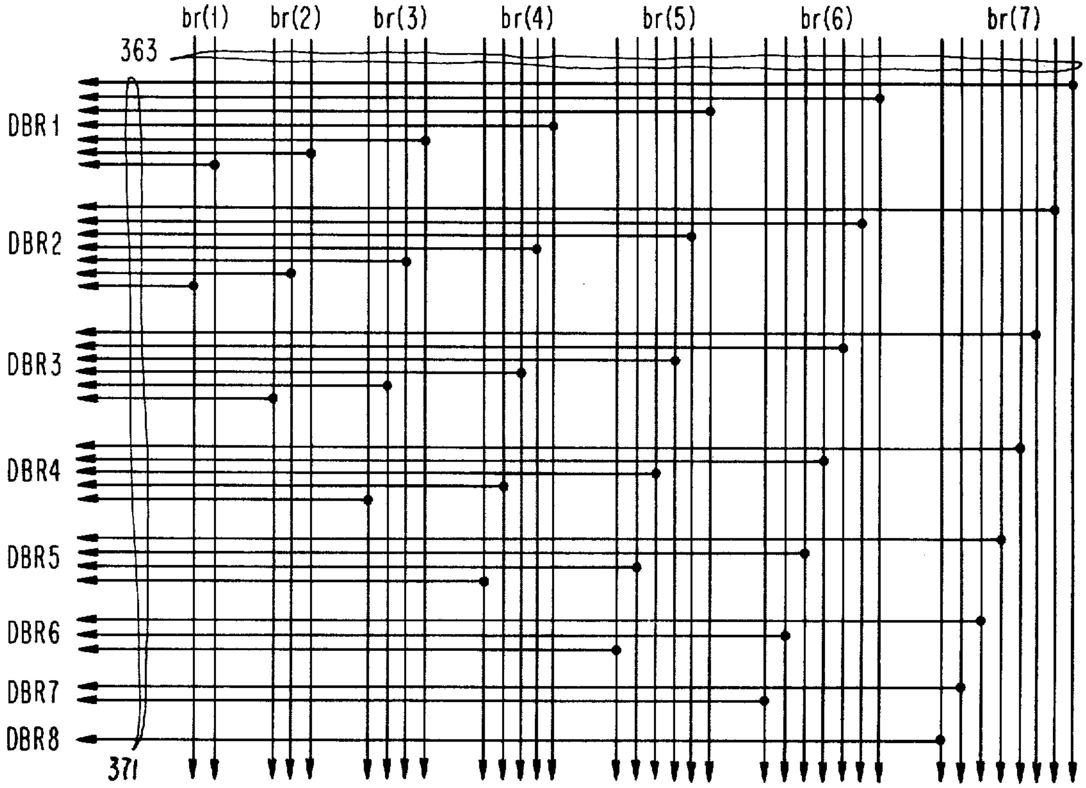
FIG. 16 is a detailed diagram of the BR router 365 of FFIG. 14.

Using router 314 of FIG. 11 as a specific example, the eighth bit of each group of wires TS(1) through TS(7), counting from the right, is supplied as the output of group of wires DTS8. In this instance, only the wire comprising bit position TS(7) has a wire therefrom to shift register input DTS8. The number of bits connected to the shift register inputs progressively increases by one until each of the various plugboard outputs is connected to the shift register input DTS2 and DTS1. Shift register DTS1 is thus connected to the rightmost bit position of each of the plugboard outputs. The routers of FIGS. 12, 15 and 16 are arranged in the identical manner to that of FIG. 11.

Figure 13:
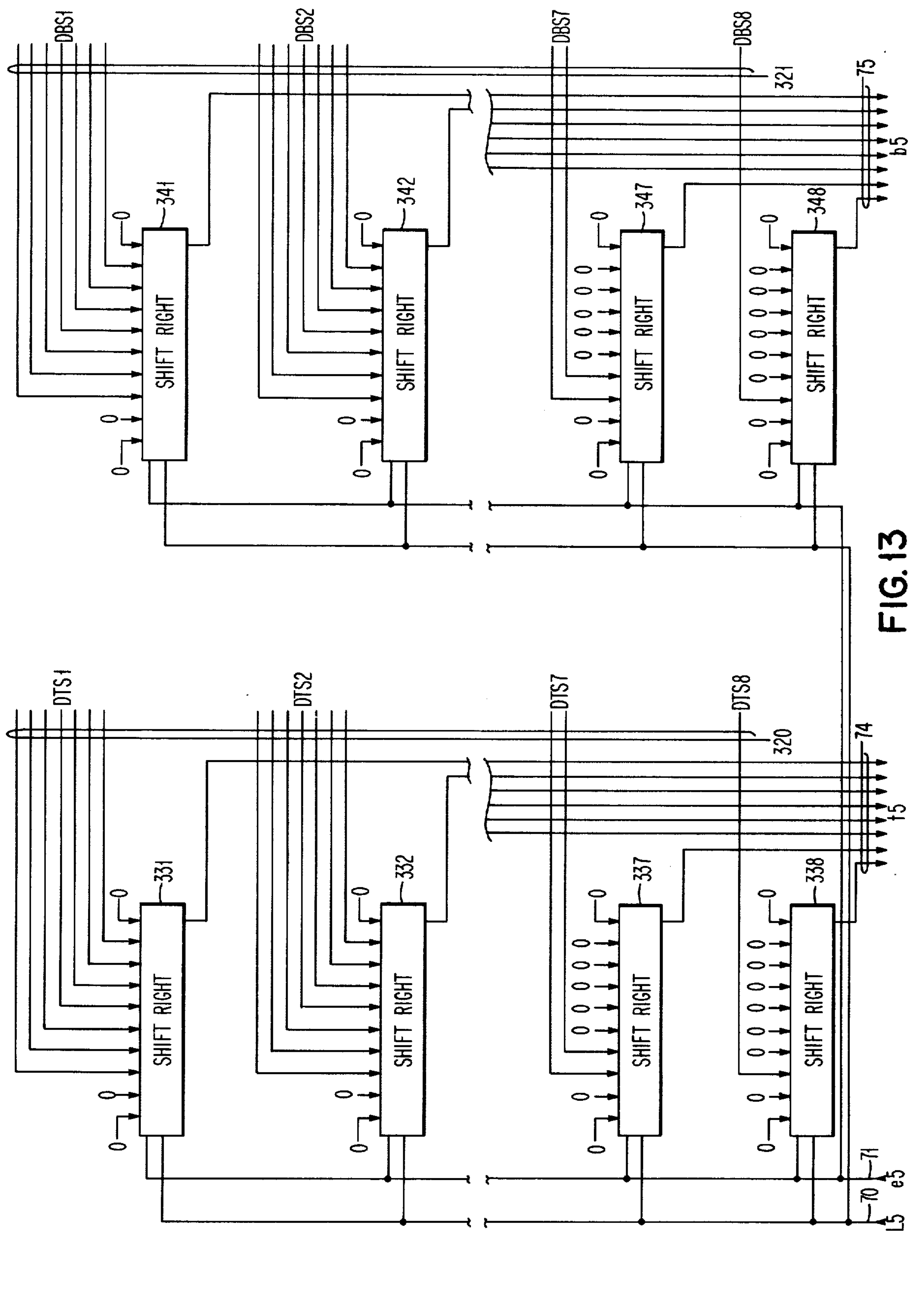
FIG. 13 is a detailed block diagram of the S shift registers 323 of FIG. 10.
Figure 17:
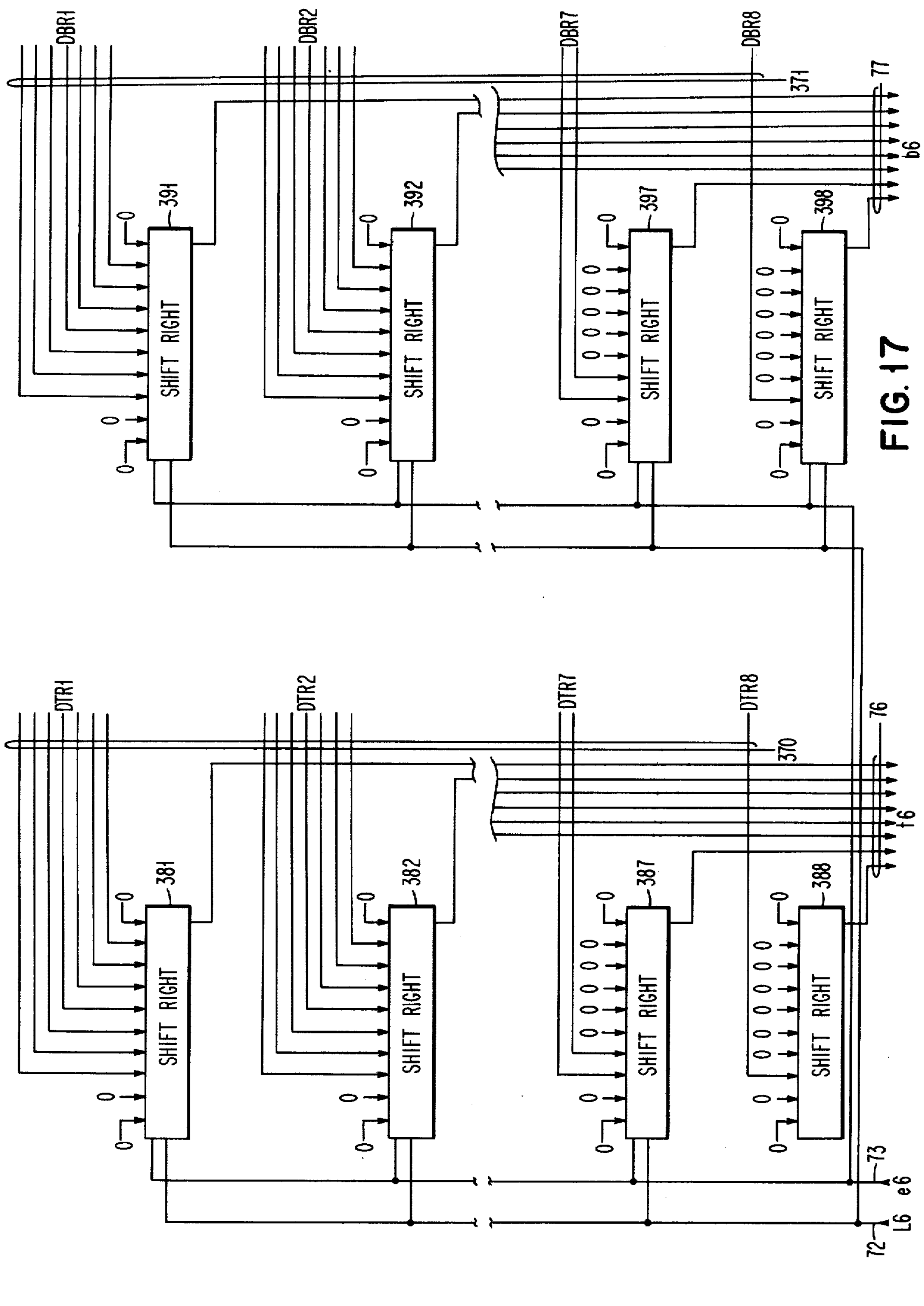
FIG. 17 is a detailed block diagram of the R shift registers 373 of FIG. 14.

Referring now to FIGS. 13 and 17, the various shift registers are illustrated. The router outputs as contained in cable 320 and comprising outputs DTS1 through DTS8 are connected to shift registers 331–338, respectively. Similarly, the router outputs comprising cable 321 and comprising individual outputs DBS1–DBS8 are connected to shift registers 341–348 respectively. With respect to FIG. 17, the router outputs contained in cable 370 and comprising outputs DTR1-DTR8 are connected to shift registers 381–388 respectively. Similarly, the router outputs comprising cable 371 and comprising individual outputs DBR1–DBR8 are connected to the shift registers 391–398, respectively. All of the shift registers are arranged so that the combination of the signal on line 71 or on line 73 accompanied by a clock pulse on line 70 or on line 72 loads the shift registers with the information then present on cables 320 and 321 or on cables 370 and 371. As indicated, certain positions of each shift register are loaded with binary zeroes from permanently affixed voltages at the inputs thereto.

When shift registers 323 and 373 have been loaded in response to clock pulses on lines 70 and 72 in the presence of signals on lines 71 and 73, the rightmost bit position of each shift register are presented to decoder 51 on cables 74–77. In particular, the rightmost bit positions of shift registers 331–338 in FIG. 13 are connected to cable 74, the rightmost bit positions of shift registers 341–348 in FIG. 13 are connected to cable 75, the right-most bit positions of shift registers 381–388 are connected to cable 76, and the rightmost bit position of shift registers 391–398 are connected to cable 77. After initial loading of shift registers 323 and 373, clock pulses on lines 70 and 72 in the absence of signals on lines 71 and 73 cause each of the shift registers to shift to the right by one bit position. As a result, a new set of data is supplied to cables 74–77.

The shifting continues until such time as the signal on line 256 of the decoder circuitry of FIG. 9 drops to indicate that the pre-established values corresponding to the supplied codeword have been selected.

An exemplary code is disclosed below, where $i$ represents the regular event designation number, $j$ represents the special event designation number, $c_r(i)$ represents the binary codeword representing the ith regular event, and $c_s(j)$ represents the binary codeword corresponding to the jth special event. This exemplary code can be used for encoding any seven regular events and any two special events. For example, the regular events may comprise seven various run lengths and the special events may comprise an end-of-line indication and an end-of-page indication.

Exemplary Code

| i | $c_r(i)$ | j | $c_s(j)$ |
|---|---|---|---|
| 1 | 00 | 1 | 01 |
| 2 | 100 | 2 | 101 |
| 3 | 1100 | | |
| 4 | 1101 | | |
| 5 | 1110 | | |
| 6 | 11110 | | |
| 7 | 11111 | | |

The implementation of the exemplary code to operate with the apparatus illustrated in FIGS. 1–17 requires the plugboard values listed below. As has been explained, when a signal is present on line 22, $k$ clock pulses supplied on line 20 to encoder tables 16 cause $b_s(k)$ and $t_s(k)$ to appear, left justified, on cables 23 and 24. When a signal is not present on line 22, $k$ clock pulses supplied on line 20 to encoded tables 16 causes $b_r(k)$ and $t_r(k)$ to appear, left justified, on cables 23 and 24. Similarly, k clock pulses supplied on lines 20 and 72 to decoded special tables 52 and decoder regular tables 53 cause $t_s(k)$, $b_s(k)$, $t_r(k)$ and $b_r(k)$ to appear, right justified, on cables 74–77. Also as has been explained, exactly $k$ clock pulses are supplied on line 20 to encoder tables 16 during the generation of a $k$-bit codeword, and exactly $k$ clock pulses are supplied on lines 70 and 72 to decoder special tables 52 and decoder regular tables 53 during the decoding of a $k$-bit codeword. Since the longest codewords in the exemplary code in FIG. 18, namely $c_r(6) = 11110$ and $c_r(7) = 11111$, comprise only 5 binary bits, plugboard values $b_r(6)$, $t_r(6)$, $b_s(6)$, $t_s(6)$, $b_r(7)$, $t_r(7)$, $b_s(7)$, and $t_s(7)$ are never supplied on cables 23–24 or on cables 74–77 during the encoding or decoding of the exemplary code. Therefore, these plugboard values can be any binary sequence, and hence they are given in Table 2 as xxxxxxx or xxxxxxxx.

Table Values (Plugboard)

| k | $b_r(i)$ | $t_r(k)$ | $b_s(k)$ | $t_s(k)$ |
|---|---|---|---|---|
| 1 | 00 | 00 | 00 | 00 |
| 2 | 001 | 001 | 001 | 010 |
| 3 | 0010 | 0101 | 0010 | 0110 |
| 4 | 00101 | 01111 | 00010 | 01111 |
| 5 | 000111 | 100000 | 000010 | 100000 |
| 6 | xxxxxxx | xxxxxxx | xxxxxxx | xxxxxxx |
| 7 | xxxxxxxx | xxxxxxxx | xxxxxxxx | xxxxxxxx |

The illustrated decoder table values are right justified. The encoder tables are left justified.

The above exemplary code is arranged for encoding or decoding two special events and seven regular events. Regular events may comprise seven various run lengths, and the special events may comprise an end-of-line indication and an end-of-page indication. Many similar codes may be developed and implemented in terms of table values such as illustrated. Similar codes with longer codewords can be implemented by simply expanding the circuitry of FIGS. 3–17 horizontally to include additional bit capacity.

The routing circuitry for the encoder and decoder tables are arranged such that the plugboards for the encoder are identical to the plugboards for the decoder. Absent the routers, the plugboards for the encoder and for the decoder would have to be arranged somewhat differently, but contain the same information. Either arrangement will work equally well although identical plugboards are envisioned as being somewhat better from a practical implementation standpoint. Thus, TS plugboard 150 in FIG. 4 is identical to TS plugboard 310 in FIG. 10. Similarly, TR plugboard 151 in FIG. 4 is identical to TR plugboard 360 in FIG. 14. Further, BS plugboard 152 and BR plugboard 153 in FIG. 4 are respectively identical to BS plugboard 311 in FIG. 10 and BR plugboard 361 in FIG. 14.

In order to better illustrate the correspondence of the above table values with respect to the arrangement of the plugboards, the output of TS plugboard 150 or TS plugboard 310 to the respective routers of FIGS. 5 and 11 will be explained. The output of router 150 is via cable 175 in FIG. 5 and the output of router 310 is via cable 312 in FIG. 11. As is seen from the expansion of the table values for plugboard $T_S$ on cables 175 or 312, each individually labeled set of wires comprising the cable represents a specific table value.

EXPANDED $T_S$ TABLE VALUES

| k | $t_s(k)$ cables 175 or 312 | | | | | | |
|---|---|---|---|---|---|---|---|
| | t(1) | t(2) | t(3) | t(4) | t(5) | t(6) | t(7) |
| 1 | 00 | | | | | | |
| 2 | | 010 | | | | | |
| 3 | | | 0110 | | | | |
| 4 | | | | 01111 | | | |
| 5 | | | | | 100000 | | |
| 6 | | | | | | XXXXXXX | |
| 7 | | | | | | | XXXXXXXX |

Referring now to the above table together with the router 160 of FIG. 5 and shift registers 182 of FIG. 7, the first table value $t(1)$ is supplied to the first bit position of shift right registers 198 and 197 via sets of wires ET8 and ET7 of cable 180. Table value $t(2)$ is supplied to the second bit positions of shift right registers 196–198 via wires ET6 – ET8 of cable 180. Each succeeding table value is thus supplied by the corresponding ones of an ever expanding set of wires of cable 180 to the next sequential bit position of a correspondingly expanding set of the shift registers.

Thus, upon the loading of the shift registers from plugboard 150 via router 160, the initial outputs of the shift register on cable 23 comprises the left-justified table value $t(1)$ followed to the right by a series of zeroes. Each subsequent clock pulse to the shift registers shifts to the next succeeding table value which is supplied in left-justified mode on cable 23 followed by an ever decreasing number of zeroes to the right.

Referring now to the output of plugboard 310 on cable 312 to router 314 in the routing of the signals therefrom on cable 320 to shift registers 323, specific reference is made to FIGS. 11 and 13. The organization of the router with respect to the above table of expanded $t_s$ table values will now be explained. The decoder plugboard output is identical to that of the previously described encoder.

Plugboard output $t(1)$ is supplied on cable 312 and the bits are respectively routed to the low order bit positions of shift registers 331 and 332 via the lines of cable 320 of groups of wires DTS1 and DTS2. Similarly, the next table value $t(2)$ is routed to the second binary position of shift registers 331–333 via lines of groups of wires DTS1–DTS3 of cable 320. Successive pre-established table values are similarly supplied via sequentially increasing numbers of wires to successive bit positions of successively increasing numbers of the shift right registers 331–338.

Upon loading the shift registers, the first pre-established table value, $t_s(1)$ is supplied from the registers on the two rightmost wires of cable 74 with fixed zeroes in the remaining wires of the cable. Upon receipt of a clock pulse, the shift registers shift to the right such that pre-established value $t(2)$ is supplied in right-justified form on cable 74 with fixed zeroes supplied in the remaining wires of the cable. Succeeding clock pulses supplied to the shift registers cause further shifting, resulting in successive pre-established values being presented on cable 74 in right-justified form with an ever decreasing number of fixed zeroes on the remaining wires.

The resultant outputs of the encoder tables via cables 23 and 24 of FIG. 4, via cables 74 and 75 of FIG. 10, and via cables 76 and 77 of FIG. 14 as the result of the operation of the associated plugboards, matrix routers and shift registers.

The encoding and subsequent decoding of one of the events in accordance with the exemplary code as implemented in the exemplary circuitry of the above embodiment of the invention will now be described.

Regular event number 5 comprises a suitable example. Referring to FIG. 1, event recognizer 10 supplies a signal on line 13 together with the binary representation of the number 5 on cable 11 and no signal on line 12. The 8-bit binary representation of the decimal value of 5 is 00000101. In FIG. 3, this binary value is received on cable 11. Thus, the top three wires comprise the binary voltages representing binary bits 101, with the remainder of the wires having the voltage representing a binary 0.

When encoder 14 is in the ready to receive state, so that latch 135 is set and latch 136 is reset, the signal on line 13 enables AND circuit 144 to gate a clock pulse from clock 110, via OR circuit 145, to line 20. This pulse together with the output of latch 135 on line 21, causes shift registers 100 and 101 to load the binary event designation therein, causes shift register 115 to be loaded with the binary value 01000000, and causes counter 130 to be loaded with the binary value 0001. As has been explained, the clock pulse on line 20 resets latch 135, thereby placing encoder 14 in the "working" state.

The clock pulse on line 20 and the signal on line 21 in the absence of the special event signal on line 22 causes the shift registers 182 of the encoder tables in FIG. 4 to be loaded with the regular event pre-established values. Thus, the encoder tables provide at that time on cables 23 and 24 the outputs $b_r(1) = 00$ and $t_r(1) = 00$ given in FIG. 18. These pre-established table values are left-justified, so that the outputs on cables 23 and 24 are both 00000000.

The contents of shift register 101, namely 01000000, is subtracted by subtraction unit 103, 104 from the all-zero output of cable 23. As the net result of this subtraction is less than zero, the output of inverter 106 to OR circuit 102 is positive. The output of OR circuit 102 on line 111 is therefore positive.

Since encoder 14 is in the working state, with latches 135 and 136 both reset, the signal on line 111 enables AND circuit 112 to gate the next clock pulse from clock 110, via OR circuit 145, to counter 100, shift registers 100 and 101, and on line 20 to the encoder tables. This clock pulse causes the encoder table shift registers to shift so that the encoder table output on cables 23 and 24 comprises $b_r(2) = 001$ and $t_r(2) = 001$ from FIG. 18, with both table values left-justified. Simultaneously, shift registers 100 and 101 and shift register 115 respond to the pulse on line 20 and to the absence of the signal on line 21 by shifting to the right one position, so that the resulting contents of these shift registers are, respectively, 00000000, 10100000 and 00100000. Simultaneously, the clock pulse increments counter 130 to the binary value 0010.

The subtractor comprising elements 103, 104 now subtracts the value from shift register 101 (10100000) from the pre-established value on cable 23 (00100000). As this result is negative, inverter 106 still supplied a positive output to OR circuit 102. AND circuit 112 thus gates the next succeeding clock pulse from clock 110 to shift register 115, shift register 100 and 101, to counter 130, and to the encoder tables on line 20.

The clock pulse on line 20 thus causes the shift registers of the encoder tables to shift one position and to supply on output cables 23 and 24 the binary information for $K$=3 as $b_r(3) = 0010$ and $t_r(3) = 0101$ from FIG. 18, with both table values left-justified. Shift register 115 shifts the binary 1 one more position to the right of input line 116 so that the output therefrom is now 00010000. Shift registers 100 and 101 also shift to the right one position so that the resultant output of shift register 100 is all zeroes and the output of shift register 101 is 01010000. Counter 130 responds to the clock pulse by incrementing the count by 1 to the binary value 0011.

The subtractor comprising elements 103, 104 now subtracts the contents of shift register 101 (01010000) from the pre-established value on cable 23 (00100000). The resultant subtraction again results in a negative number so that inverter 106 supplies a positive output via OR circuit 102 to line 111. This signal again enables AND circuit 112 to gate the next succeeding clock pulse from clock 110 to line 20.

This clock signal causes the shift registers of the encoder tables to supply as the output therefrom on cables 23 and 24 the binary information $b_r(4) = 00101$ and $t_r(4) = 01111$, again left-justified. This is illustrated in the encoder tables of FIG. 18 for $k$=4 at Columns Br and Tr, respectively. Shift register 115 shifts the binary 1 an incremental step further to the right of the original input line 116. The resultant output of the shift register is 00001000. Shift registers 100 and 101 similarly are shifted, the output of shift register 100 still comprising all zeroes and the output of shift register 101 then comprising 00101000. Counter 130 is incremented to the binary value 0100. Now, the resultant subtraction by subtraction unit 103, 104 of the output of shift register 101 (00101000) from the content of cable 23 (00101000) is no longer negative. A positive output signal is thus supplied on line 105, which is inverted by inverter 106. No positive outputs are therefore supplied to OR circuit 102 and no signal is supplied on line 111. Thus, AND circuit 112 is disabled. The lack of a signal on line 111 is inverted by inverter 149 to supply a positive enabling signal to AND circuit 143.

The next succeeding clock pulse from clock 110 is therefore blocked by AND circuits 144 and 112, but is gated by AND circuit 143 to set latch 136, thereby placing encoder 14 in the ready to transfer state. The resulting output signal on line 27 indicates that the codeword is present on cable 29 and the binary designation of the codeword length is present on cable 28.

The codeword on cable 29 is derived in the following manner. The output of the subtraction unit comprising elements 103, 104 is the result of the subtraction of the contents of shift register 101 (00101000) from the content of cable 23 (00101000). This net result is all zeroes (00000000). The output of the subtraction unit 117, 118 comprises the subtraction of the output of shift register 115 (00001000) from the binary content of cable 24 (01111000) as illustrated in FIG. 18. The net result supplied as the output of the subtractor 117, 118 is 01110000. The subtraction unit 123, 124 then subtracts the output of the subtraction unit 103, 104 (00000000) from the output of subtraction unit 117, 118 (01110000). The net result of this subtraction, excluding the high order bit of subtraction unit element 123, is 1110000.

The operation of the circuitry of FIG. 3 has thus resulted in the production of the appropriate codeword (1110) left-justified on cable 29 together with the codeword length (100) on cable 28. The generation of this codeword has required only 5 clock pulses, one to load the shift registers, three to access successive pre-established table values, and one to set latch 136, thereby indicating that the codeword has been generated.

Referring now to FIG. 8, the signal on line 27 provides an enabling input to AND circuit 216. When the shiftout circuitry is in the ready to receive state, so that latch 212 is set and latch 213 is reset, a clock pulse on line 26 is thus gated via AND circuit 216 to line 25. This pulse is routed via OR circuit 210 to the reset input of latch 212, via OR circiut 221 to decrementing counter 223 and shift register 224, and to the set input of latch 213. The combination of the clock pulse with the output of latch 212 on line 220 causes counter 223 and shift register 224 to load the information from cables 28 and 29. In the present example the codeword 1110 is thereby loaded into the leftmost 4 bit positions of shift register 224 while the codeword length 100 is loaded into counter 223.

The pulse on line 25 is additionally supplied to OR circuit 142 in FIG. 3. This pulse sets latch 135 and resets latch 136, thereby returning encoder 14 to the ready to receive state, so that this circuitry can accept the succeeding event designation.

The setting of latch 213 and the resetting of latch 212 in FIG. 8 place this shiftout circuit in the ready to transfer state. The set output of latch 213 provides a signal on line 41 to the receive device. The signal on line 41 is accompanied on line 40 by the leftmost bit in shift register 224, which is the leftmost bit of the codeword (1110). Acceptance of this bit is signaled by means of a clock pulse on line 42. This pulse is gated via OR circuit 221 to decrement counter 223 and to shift left by one bit position shift register 224. In the present example, the resulting contents of counter 223 and shift register 224 are 0011 and 11000000, respectively. Thus, the second bit of codeword 1110 is made available on line 40.

The acceptance pulse on line 42 is additionally supplied to AND circuit 228, which is under the enabling control of AND circuit 226 and inverters 225. AND circuit 228 is enabled only when the last 3 bits in counter 223 are 001, the binary equivalent of decimal 1. Hence, AND circuit 228 is enabled only when the codeword bit whose acceptance is signaled by a clock pulse on line 42 is the final bit of a codeword. In the present example, the codeword 1110 comprises 4 bits, and the initial contents of counter 223 is 0100. Therefore, the first acceptance pulse on line 42 is not gated via AND circuit 228, and the shiftout circuitry remains in the ready to transfer state.

Acceptance of the second bit of the codeword is signaled by the acceptance device by means of another clock pulse on line 42. The clock signal is supplied by OR circuit 221 to counter 223 and to shift left register 224. The counter decrements to a count of 010, representing the binary equivalent of a decimal 2. Shift left register again shifts to the left one binary position to provide the 3rd bit of the codeword 1110 on line 40. As counter 223 has not yet decremented to a count of 001, AND circuit 228 remains disabled, and the shiftout circuitry remains in the ready to transfer state.

The acceptance device signals acceptance of the third binary bit by a further clock pulse on line 42. Once again, AND circuit 228 is disabled and the signal is supplied by OR circuit 221 to counter 223 and shift left register 224. Counter 223 thus decrements to a count of 001, while shift left register 224 shifts one bit position to the left to provide the fourth and final bit of the codeword 1110 on line 40. Upon counter 223 decrementing to the 001 condition, inverter 228 inverts the low order output of the counter. Thus, no signals are supplied to OR circuit 229 and inverter 227 then supplies an enabling signal to AND circuit 226.

The acceptance device then signals acceptance of the last bit of the codeword by means of another clock pulse on line 42. This time, the output of counter 223 is 001, so that inverters 225 and AND circuit 226 provide an enabling input to AND circuit 228. Hence, the clock signal is gated by AND circuit 228 to OR circuit 211, which transmits the signal to reset latch 213. This terminates the output signal on line 41, which indicates to the acceptance device that the entire codeword has been supplied.

As described previously, the reset condition of latch 213, together with the reset condition of latch 212, constitute a temporary transitional state for the shiftout circuitry. In this state the reset outputs of both latches provide enabling inputs to AND circuit 215. Hence the next clock pulse from clock 110 on line 26 is gated by AND circuit 215 to set latch 212, thereby returning the shiftout circuitry to the ready to receive state.

At some point, the codeword 1110 may be supplied to decoder 51 in FIG. 2. Operation of the decoder in conjunction with the operation of decoder tables 52 and 53 will now be discussed.

Referring now to FIG. 9, the codeword is supplied from a storage device, from a transmission link, or directly from the encoder output of FIG. 1. First, a signal is supplied therefrom on line 61 to indicate that the first bit of the codeword is present on line 60. As before, the exemplary codeword is 1110 reading from left to right. When decoder 51 is in the ready to receive state, latch 280 is in the set condition, latch 281 is in the reset condition and latch 282 is in the set condition. Thus, latch 280 supplies an enabling signal to AND circuit 230. The signal on line 61 provides a further enabling signal to the same AND circuit, that the next succeeding clock pulse from clock 255 on line 290 is gated by AND circuit 230 to OR circuit 235. The set output from latch 280 is also supplied on line 301 to shift left register 234 and on lines 71 and 73 to the shift registers of the decoder tables. The clock pulse is transmitted by OR circuit 235 on line 302 to the clock input of shift left register 234 and on lines 70 and 72 to the shift registers of the decoder tables. The combination of these signals causes the shift registers of the decoder tables to be loaded and causes the shift left register 234 to load the fixed inputs thereto and to load the first bit of the codeword on line 60 into the low order bit position via input line 232.

The clock pulse on line 302 is also supplied on line 62 to indicate acceptance of the first bit of the codeword and to reset latch 280. The latch therefore terminates the signal on line 300, disabling AND circuit 230 and terminates the signal on line 301 to prevent further loading of the shift registers. When reset, latch 280 supplies a signal on line 305 to AND circuit 295. Latch 281 remains reset so as to supply an output signal on line 303 to AND circuit 231. The decoder is thus in the working state.

At this time, shift register 234 contains the first bit of codeword 1110, namely 1, preceded by seven zeroes. The shift registers of the decoder tables have been loaded with pre-established values listed in FIG. 18. Thus, output $t_s(1) = 00$ is supplied on cable 74, output $b_s(1) = 00$ is supplied on cable 75, output $t_r(1) = 00$ is supplied on cable 76 and output $b_r(1) = 00$ is supplied on cable 77. All four outputs are supplied on cables 74–77 in right-justified form, with zeroes on the remaining wires thereof. The all-zero output on cable 74 is supplied to subtraction unit 240, 241 to be subtracted from the output of shift left register 234 (00000001). As the net result of this subtraction is a non-negative number, a signal is present on line 256. This signal, together with the signals on lines 303 and 61, enables AND circuit 231 to gate the next clock pulse from clock 255 on cable 290 to OR circuit 235.

Again, the clock pulse is transmitted by OR circuit 235 to line 302, to shift left register 234, and on lines 70 and 72 to the shift registers of the decoder tables. As a result of the previous acceptance pulse on line 62, the codeword supply mechanism now supplies the 2nd bit of the codeword (1110) on line 60. Shift register 234 responds to the clock pulse on line 302 by shifting to the left and shifting in the second bit of the codeword via shift-in input 233. The content of shift register 234 is therefore 00000011. The clock pulse on lines 70 and 72 causes the shift registers of the decoder tables to provide as outputs $t_s(2) = 101$ on cable 74, $b_s(2) = 001$ on cable 75, $t_r(2) = 001$ on cable 76 and $b_r(2) = 001$ on cable 77, with all table values right-justified.

Subtraction unit 240, 241 therefore subtracts the pre-established value on cable 74 (00000010) from the output of shift left register 234 (00000011). Once again, the subtraction result is a non-negative number, so that a positive signal is supplied on line 256.

The clock pulse gated by OR circuit 235 onto line 62 signals the codeword supply apparatus of the acceptance of the second bit of the codeword. That apparatus therefore supplies the 3rd bit (1) of the codeword on line 60.

The positive signal on line 256, together with signals on lines 61 and 303, enables AND circuit 231 to gate the next clock signal to OR circuit 235. Once again, this signal is supplied on line 302 to cause a shift of the shift left register 234 and of the shift registers of the decoder tables. The clock signal is also supplied on line 62 to signal acceptance of the third bit of the codeword by shift left register 234, whose contents are now 00000111. The clock pulse causes the decoder tables to supply as outputs the values $t_s(3) = 0110$, $b_s(3) = 0010$, $t_r(3) = 0101$, and $b_r(3) = 0010$ given in FIG. 18.

Subtractor unit 240, 241 subtracts the pre-established value on cable 74 (00000110) from the output of shift register 234 (00000111). Once again, the result of the subtraction is a non-negative number, causing a positive signal to be supplied on line 256 to then gate the next appearing clock pulse from clock 255 to OR circuit 235. The preceding clock pulse supplied on line 62 has caused the codeword supply apparatus to supply the 4th, and last, bit of the codeword (1110) on line 60. The clock pulse is transmitted by the OR circuit 235 to shift left register 234 and to the shift registers of the decoder tables. Shift left register 234 therefore shifts to the left and shifts in the 0 bit of the codeword via input 233. The resultant contents of register 234 comprises 00001110. At the same time, the shift registers of the decoder tables provide the values $t_s(4) = 01111$, $b_s(4) = 00010$, $t_r(4) = 01111$ and $b_r(4) = 00101$, right-justified on cables 74-77.

Subtractor unit 240, 241 therefore subtracts the pre-established value at cable 74 (00001111) from the output of shift register 234 (00001110). The result of this subtraction is a negative number which terminates the signal on line 256. This disables AND circuit 231 so that no more clock pulses will be transmitted thereby.

The absence of a signal on line 256 is used by inverter 304 to provide an enabling input to AND circuit 295. Since the decoder is in the working state, characterized by the reset condition of latches 280 and 303, the next clock pulse appearing on line 290 is gated via AND circuit 295 to set latch 281. This places the decoder in the ready to transfer state, in which the signal from latch 281 on line 82 indicates to event regenerator 50 that an event designation is present on cable 80 and line 81. The operation of the decoder circuitry in FIG. 9 to determine this event designation will now be described.

The result of the subtraction by subtractor 240, 241 of the pre-established value on cable 74 (00001111) from the output of the shift register 234 (00001110) is all 1's. This output represents a negative 1 and is supplied to adder circuitry 260, 261. Adder 260, 261 adds this value to the pre-established value on cable 75 (00000010) and adds to this result a 1 from line 262. The result of this addition is 00000010, which is supplied to gate circuit 263.

At the same time, subtraction unit 242, 243 subtracts the contents of cable 76 (00001111) from the output of shift register 234 (00001110). The result of that subtraction is negative, resulting in the absence of an output signal on line 276. The precise result of the subtraction is all 1's and is supplied to adder 270, 271. The adder adds the output of subtractor 242, 243 (11111111) to the output of the decoder tables on cable 77 (00000101), and adds to that result a 1 appearing on input line 272. The result of that addition, 00000101, is supplied to gate circuit 273.

As discussed, no output signal is supplied by subtractor 242, 243 on line 276. Thus, no enabling signal is supplied to enabling input 264 of gate circuit 263. Inverter 275, however, supplies a positive output signal on line 274 to gate circuit 273. Gate circuit 263 thus blocks the output of adder 260, 261 and gate circuit 273 supplies the output of adder 270, 271 (00000101) to OR circuits 265, and hence to cable 80. The resultant output on cable 80, 00000101, is the 8-bit binary equivalent of a decimal 5, which represents the fifth event designation. No output is supplied on line 81, indicating that the event designation is a regular event rather than special event.

As shown by the above example, encoder 14 in FIG. 1 responds to the event designation by accessing corresponding pre-established values from encoder table 16 by a shifting process and then combines the event designation value with the pre-established values to provide a codeword which is serialized by shift-out circuitry 17. Decoder 51 in FIG. 2 selects corresponding pre-established values from decoder tables 52 and 53 by a similar shifting process and combines the received codeword with selected pre-established values to determine the event designation, which is then supplied on cable 80 and on 81.

Figure 19:
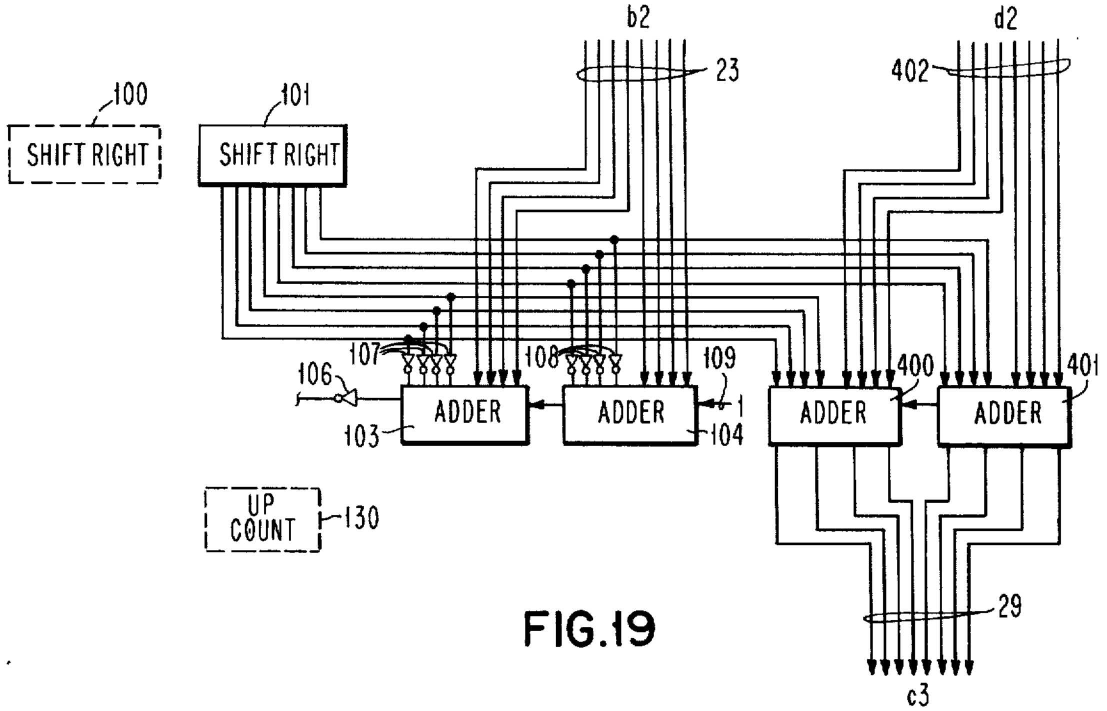
FIG. 19 is a partial block diagram of another embodiment of an encoder select/combine apparatus 14 of FIG. 1.
Figure 20:
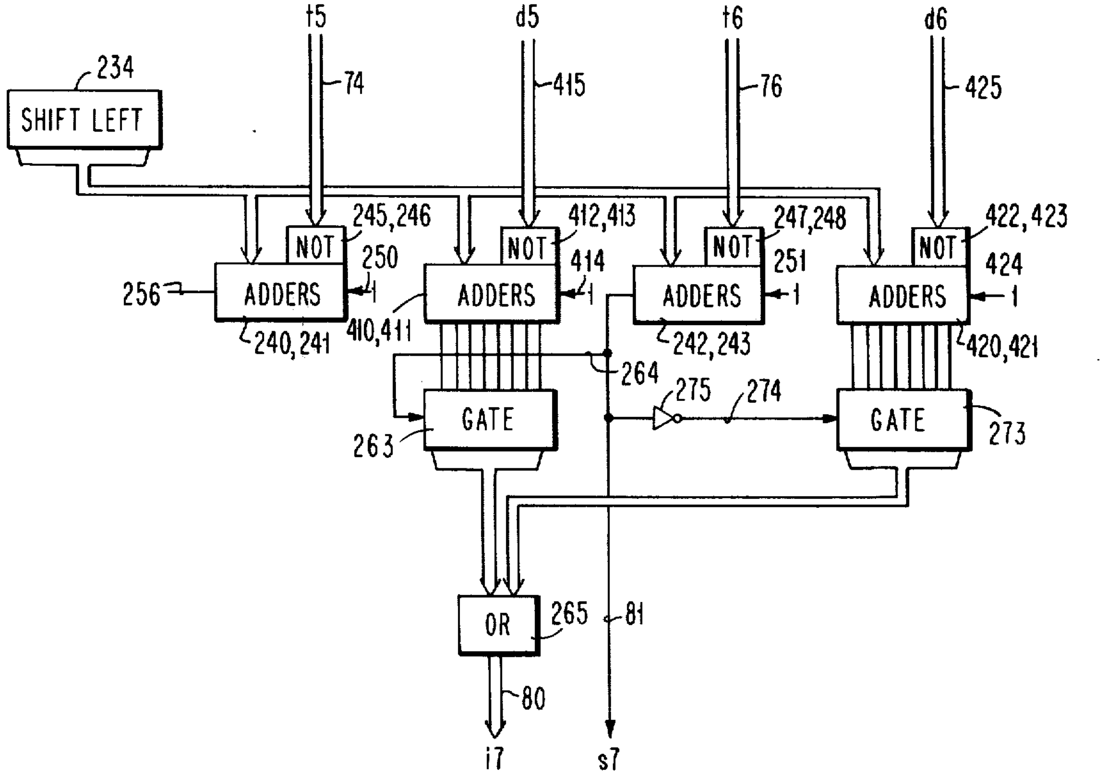
FIG. 20 is a partial block diagram of another embodiment of a decoder select/combine apparatus 51 of FIG. 2.

FIGS. 19 and 20 disclose exemplary changes in encoder select/combine circuitry 14 and decoder select/combine circuitry 51 to accommodate a different set of tables. The only difference from the encoder table 16 of FIGS. 4, 5, 6 and 7 is that the TS and TR plugboards 150 and 151 of FIG. 4 are replaced with DS and DR plugboards. In the circuitry of FIG. 19, the subtraction unit 103, 104 and shift right registers 100 and 101 remain intact. Eliminated from the apparatus of FIG. 3 are shift right register 115, subtractor 117, 118 and subtractor 123, 124. The resultant circuitry is thus much simpler and faster and includes adder 400, 401 to add the output of the encoder tables Dr or Ds on cable 402 to the output of shift right register 101. The net result of this addition is supplied on output cable 29 to shift out circuitry 17 of FIG. 1.

The relationship between "Dr" encoder and decoder tables of FIG. 19 and the "Tr" and "Br" tables of FIG. 18, is summarized by the following mathematical formula: $Dr(k)=Tr(k)-Br(k)-1$. The special "Ds" table values obey the same mathematical formula with respect to the special tables of FIG. 18.

The differences in the tables are accounted for by the logical difference between the circuitry of FIG. 19 and that of FIG. 3.

The corresponding decoder is illustrated in FIG. 20. Most of the circuitry of the decoder in FIG. 9 is retained for that FIG. 20, including: shift left unit 234; adders 240 and 241, which function together with inverters 245, 246 and input 250 to function as a subtractor; similar adders 242, 243, which function as subtractors; gating circuits 263 and 273; and the OR circuit 265 leading to output 80. The changes comprise the substitution of adders 410, 411, inverters 412, 413 and input 414 to subtract the Ds output of the encoder tables on 415 from the content of shift left unit 234, rather than the adders 260, 261 of FIG. 9 for adding the output of the subtraction unit 240, 241 to the decoder output on cable 75. The output of the subtraction unit 410, 411 is supplied to gate circuit 263, which is operated in conjunction with the special signal on line 81 to supply the special event number to OR circuit 265 and thence to cable 80.

Similarly, adders 420, 421, inverters 422, 423 and input 424 combine to subtract the Dr output of the encoder tables on cable 425 from the output of shift left unit 234. Once again, this differs from the circuitry of FIG. 9 which employed adders 270 and 271 to add the output of the subtraction unit 242, 243 to the decoder table output on cable 77. In the absence of the special event designation signal on line 81, inverter 275 operates gate 273 to transmit the regular event number from the subtraction unit 420, 421 to OR circuit 265 and to cable 80.

Various other combinations of encoder tables and combinatorial logic and decoder tables and combinatorial logic may also be envisioned. The essential portions of the present invention have been described above, including various specific exemplary embodiments.

Figure 21:
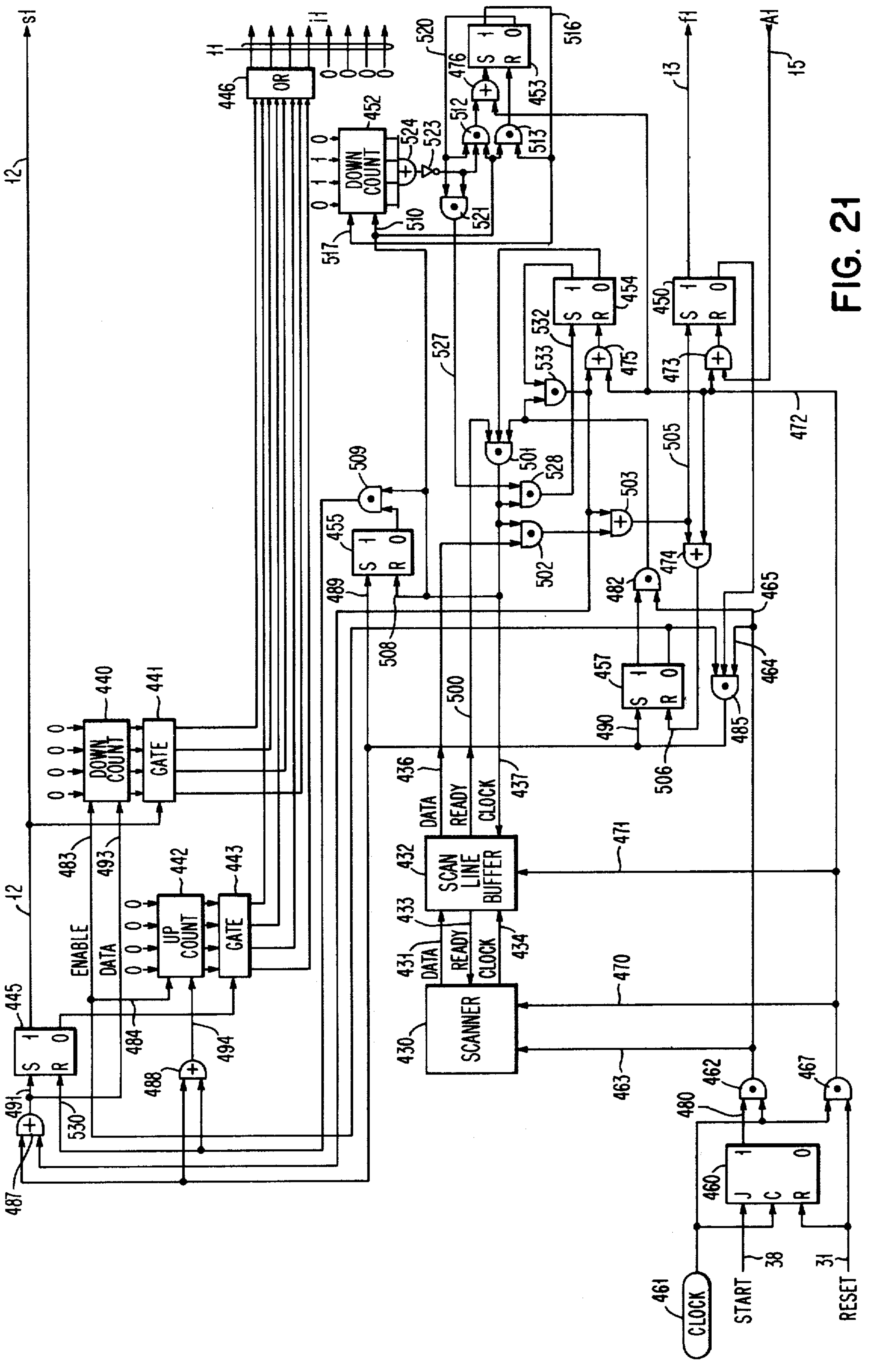
FIG. 21 is a detailed block diagram of an embodiment of an event recognizer 10 of FIG. 1.

Exemplary input and output units which establish or utilize the data compressed and decoded by the described circuitry will now be discussed. FIG. 21 describes an exemplary event recognizer 10 of FIG. 1.

The source of data in the event recognizer is a scanner 430. The scanner may be of any suitable type, such as of the vidicon type. For the purpose of illustration, the scanner is assumed to be scanning character image information in the form of 8-bit horizontal scans. The data is supplied on line 431 to a set of scan line buffers 432. The scan line buffers supply a ready signal on line 433 to initiate a scan operation. Scanner 430 also supplies clock signals on line 434 to the scan line buffers. The data supplied by the scanner on line 431 to the scan line buffers merely comprises ones and zeroes representing the black or white significance of each bit position of the scanned image.

The scan line buffers 432 subsequently supply data from line 436 in response to clock signals on line 437 to operate the event recognizer circuitry. The event recognizer circuitry responds to all runs of data to produce an event designation number in parallel on cable 11 and to provide a special event indicator on line 12 when appropriate. For the purpose of the illustration, a run is defined as a one or as a string of one or more zeroes and the first one following this string of zeroes. If the string of zeroes terminates in an end of line for the scan rather than with a one, the entire string is considered simply as the end of line special event. In the exemplary circuitry of FIG. 21, the special events include as special event 1, the end of line, and as special event 2, a run of length 1. Regular events No. 1 through No. 6 are, respectively, runs of lengths 2 through 7, so that the regular event designation number for a run is the length of that run minus 1. That is, the regular event designation number is precisely the number of zeroes in the run. Thus, a run of length 2 (which is a 01) is regular event No. 1.

As an example, a scan line of eight consecutive zeroes and no ones, is encoded simply as an end of line, special event No. 1. For further illustration, a scan line comprising seven consecutive zeroes followed by a one, is encoded as a run of length 8, regular event No. 7, followed by an end of line, special event No. 1. Conversely, if the scan line comprises a string of eight consecutive 1 bits, the circuitry of FIG. 21 encodes this as eight consecutive runs of length 1, special event No. 2, eight times, followed by an end of line, special event No. 1. Further, a scan line comprising seven consecutive 1 bits, followed by one 0 bit, will be encoded as seven runs of length 1, special event No. 2, seven times, followed by an end of line special event No. 1.

As a further example, a scan line comprising the following 8 bits, 00110100, is defined by the exemplary event recognizer as comprising a run of length 3, followed by a run of length 1, followed by a run of length 2, followed by an end of line. This would thus be encoded as regular event No. 2, followed by special event No. 2, followed by regular event No. 1, followed by special event No. 1.

In FIG. 21, down counter 440 establishes the special event designation number which may be gated to cable 11 by gate circuit 441. Up counter 442 establishes the regular event designation number, which may be gated to cable 11 by gate circuit 443. Latch 445 controls gates 441 and 443, and indicates whether the event is regular or special by supplying a signal on line 12 when the event is a special event. OR circuits 446 transmit the output of gate 441 or gate 443 to cable 11. As the circuitry of the exemplary event recognizer provides a maximum event designation number of seven, OR circuit 446 is connected to only four lines of cable 11. The remaining four lines of the cable are permanently supplied with a voltage level that indicates a binary 0. Several signals may appear on cable 11 or on line 12 until a definite event designation is selected. At the time an event is selected, latch 450 supplies a signal on line 13. Subsequently, encoder 14 signals acceptance of the available data by supplying a clock pulse on line 15.

Counter 452 is preset to a binary count of six with the first pulse of each scan line and is subsequently decremented by each clock pulse to reach a count of zero immediately prior to the last pulse of the scan line. Latches 453 and 454 then combine to operate latch 445 and counters 440 and 442 to indicate a run followed by an end of line special event No. 1 if the last data bit on line 436 was a one, or to simply indicate an end of line, special event No. 1 if the last data bit on line 436 was a zero.

Latch 455 is employed to block one clock pulse from counter 442 during the counting of subsequent zeroes as data from line 436. This allows the output of counter 442 to be one less than the total run length, which is required because each regular event designation number is one less than the run length that it designates.

Lastly, latches 450 and 457 control the operational characteristics of the event recognizer circuitry in the following way. Immediately following a reset signal that was applied to line 31, both latches 457 and 450 are reset and the event recognizer circuitry is ready to accept data from scan line buffers 432, when the circuitry of FIG. 21 is ready to transfer data on cable 11 and line 12, latch 457 is reset and latch 450 is in the set state. The situation where both latches are set cannot exist.

Referring now in more detail to the operation of the circuitry of FIG. 21, clock latch 460 controls the initialization of the event recognizer circuitry.

Inputs to latch 460 comprise start line 38, reset line 31 and clock 461. Upon application of a reset signal on line 31, the subsequently appearing clock pulse from clock 461 will operate to reset latch 460. Resetting the latch 460 will operate to block AND circuit 462 to prevent the application of clock pulses to lines 463, 464 or 465. Also, the combination of the reset signal on line 31 and the clock pulse will operate AND circuit 467 to supply a reset pulse to scanner 430 on line 470, to the scan line buffers 432 on line 471, and to the event recognizer circuitry on line 472. The reset pulse on line 472 is transmitted by OR circuits 473, 474 and 475 to reset latches 450, 457 and 454, and transmitted by OR circuit 476 to set latch 453.

A subsequent start signal on line 38 causes latch 460 to operate to the set state upon the next following clock pulse from clock source 461. In this state, latch 460 supplies a signal on line 480. Thus, subsequent clock pulses from source 461 will be gated by AND circuit 462 to scanner 430 on line 463 and to the event recognizer circuitry on lines 464 and 465. Clock pulses are supplied to the scan line buffers 432 from scanner 430 on line 434 and from the event recognizer circuitry on line 437.

The set output of latch 457 is connected to AND gate 482. As the latch is initially reset, AND circuit 482 blocks clock pulses on line 465 from the event recognizer circuitry. The reset output of latch 457 is applied to enabling input 483 of counter 440, to enabling input 484 of counter 442, and to AND circuit 485. The reset output of latch 450 provides a further enabling input to AND circuit 485. AND circuit 485 thus gates the first clock pulse from AND circuit 462 to OR circuit 487, OR circuit 488, to the set input 489 of latch 455 and to the set input 490 of latch 457. OR circuit 487 transmits the clock pulse to set input 491 of latch 445. This operates latch 445 to supply a special event output signal on line 12 and a signal to operate gate 441. OR circuit 487 also transmits the clock pulse to the pulse input 493 of counter 440. The combination of the enable signal on line 483 with the pulse on line 493 operates counter 440 to load an initial count of a binary 2. As latch 445 has operated gate 441, a binary 2 is supplied by the gate to OR circuit 446 for output on cable 11. The event recognizer circuitry is therefore arranged to indicate a special event No. 2 if the first data bit detected from the scan line buffer on line 436 is a binary 1.

OR circuit 488 transmits the clock pulse from AND circuit 484 to input 494 of counter 442. The combination of the enabling signal at input 484 with the clock pulse on line 494 causes counter 442 to be loaded with an all-zero input. The clock pulse also operates to set latch 455 and set latch 457.

Assuming that the scan line buffers 432 are ready to supply a scan line of data to the event recognizer, a signal is supplied therefrom on line 500 to AND circuit 501. Thus, AND circuit 501, under the control of line 500 and latch 454, transmits clock pulses to the event recognizer circuitry and on line 437 to the scan line buffers 432 to control the transfer of scan line data information to the event recognizer circuitry.

In that the "ready" signal remains present on line 500, latch 457 remains set, and latch 454 remains reset, a clock pulse appearing at input 465 is gated by AND circuits 482 and 501 to line 437. This clock pulse operates the scan line buffers to acknowledge receipt of the first data bit on line 436. The output of AND circuit 501 is also supplied to input 510 of counter 452 and to AND circuit 512 and 513. AND circuits 512 and 513, together with counter 452 and latch 453 operate to count the clock pulses supplied on line 437 to the scan line buffers, and thereby count the scan line length and thereby detect the end of a scan line.

Specifically, the previously considered reset pulse on line 472, transmitted by OR circuit 476, sets latch 453. The latch therefore supplies an output on line 516 to enable AND circuit 513 and to supply an enable signal at input 517 of counter 452. The absence of a signal from the set output of latch 453 served to block AND circuit 512. As previously discussed, application of the clock pulse from AND circuit 501 on line 437 to the scan line buffers also results in application of the clock pulse to input 510 of counter 452. The combination of the clock pulse at input 510 with the enabling signal on line 517 results in loading counter 452 with the binary input 0110, which is equal to a decimal 6. The same clock pulse is gated by AND circuit 513 to the reset input of latch 453. This resets the latch to terminate the signal on line 516 and at input 517 of the counter 452. Subsequent clock pulses at input 510 to the counter will therefore serve to decrement the count.

The second clock pulse appearing at input 510 appearing at input 510 therefore causes counter 452 to decrement to a binary count of 5. Each subsequent clock pulse similarly decrements the counter such that the third clock pulse decrements the count to 4, the fourth clock pulse decrements the count to 3, the fifth clock pulse decrements the count to 2, the sixth clock pulse decrements the count to 1, and the seventh clock pulse decrements the count to 0. Under all conditions of the counter except for 0, the counter supplies a 1 output on at least one of its output lines to OR circuit 524, so that the OR circuit thus supplies a signal to inverter 523, which therefore blocks AND gates 512 and 521.

Upon occurrence of the seventh clock pulse, which decrements counter 452 to 0, OR circuit 524 then supplies no signal to inverter 523 which therefore supplies a signal to enable AND circuits 512 and 521. The combination of the reset output signal on line 520 from latch 553 with the signal from inverter 523 causes AND circuit 521 to transmit a signal on line 527 to AND circuit 528.

The signal on line 527 is the indication that the subsequent clock pulse supplied on line 437 will acknowledge receipt from the scan line buffers 432 of the last bit of the scan line.

The description now returns to the response of the event recognizer circuitry to the first data bit appearing on line 436 from the scan line buffers.

If the first data bit is a 1, the combination of the clock pulse from AND circuit 501 and the data signal on line 436 operate AND circuit 502 to supply a clock pulse to OR circuit 503. OR circuit 503 transmits the pulse to set input 505 of latch 450 and, via OR circuit 474, to reset input 506 of latch 457. This sets latch 450 and resets latch 457, thereby placing the event recognizer circuitry in the condition where it is ready to transmit data and not ready to receive data. Latch 457 therefore prevents further clock pulses from being transmitted by AND circuit 482 to the clock input 437 of the scan line buffers 432. The setting of latch 450 supplies an output signal on line 13 to the encoder 14 of FIG. 1, to indicate that an event designation is present on cable 11 and line 12. It will be recalled that the output of the event recognizer circuitry at this time comprises a special event signal on line 12 and the event designation number 2 on cable 11 from counter 440. Thus, special event No. 2 is indicated, which comprises a run of length 1, or a one appearing at line 436 not following a string of 0 bits.

On the other hand, if the first data bit of the scan line is a zero, then no signal is supplied to AND circuit 502, which therefore blocks the clock pulse appearing from AND circuit 501. The clock pulse operates to reset latch 455 at input 508 thereto and operates to decrement counter 452 at input 510. The clock pulse further operates on line 437 to acknowledge receipt of the next data bit from scan line buffers on line 436. Finally, the clock pulse is transmitted to AND circuit 509, which is blocked by the absence of a signal from the reset output of latch 455.

The initial 0 data bit and the clock pulse which acknowledges it has no other effect on the event recognizer circuitry than to reset latch 455 and decrement counter 452.

Assuming that the end of line has not yet been reached, the next clock pulse appearing on line 465 will be transmitted by AND circuits 482 and 501 to line 437, to input 508 of latch 455, to AND circuit 509 and to input 510 of counter 452. In this instance, however, latch 455 has been previously reset and now supplies a gating signal to AND circuit 509. AND circuit 509 therefore transmits the clock pulse via OR circuit 488 to input 494 of counter 442 and to input 530 of latch 445. This pulse increments counter 442 to a count of 1 and resets latch 445. Resetting latch 445 terminates the signal on line 12 and blocks gate 441 to prevent further application of the special event designation signal and the special event designation number at the output. Resetting latch 445 also causes the reset output of the latch to apply a signal to gate 443 to transmit the regular event designation number of 1 from the counter 442 to the output. This result occurs whether or not the data bit from the scan line buffers is a 1 or a 0. If the data bit is a 0, nothing further occurs. If the data is a 1 bit, its results will be explained later.

Subsequent consecutive 0 bits in the scan line buffer result in the continued incrementing of counter 442 for each applied clock pulse. Thus, the output appearing therefrom on cable 11 is equal to one less than the number of applied clock pulses.

Upon encountering a one bit on line 436, AND circuit 502 and OR circuits 503 and 474 transmit the clock pulse to input 505 of latch 450 and to input 506 of latch 457. This pulse therefore alters the condition of both latches, setting latch 450 and resetting latch 457. Resetting latch 457 causes AND circuit 482 to prevent the application of any further clock pulses on line 465 to the event recognizer circuitry and to scan line buffers 432. The set output from latch 450 on line 13 indicates to the encoder 14 in FIG. 1 that the output on cable 11 and line 12 represents the next event to be encoded. The event designation number on cable 11 is therefore the last count of counter 442 and the absence of a signal on line 12 indicates that a regular event designation number is available on cable 11.

Upon the encoder circuitry 14 of FIG. 1 indicating by a pulse on line 15 that the data on cable 11 and line 12 has been accepted, OR circuit 473 transmits the pulse to latch 450. Latch 450 is reset to terminate the signal on line 13 and the reset output supplies a signal to AND circuit 485. Latch 457 remains in the reset condition from the data pulse applied via AND circuit 502 and OR circuits 503 and 474 representing the initial 1 bit, or the 1 bit following one or more zeroes. Thus, latch 457 supplies its reset signal to AND circuit 485. The combination of the reset outputs from latches 457 and 450 cause the next succeeding clock pulse to be gated by AND circuit 485 to set latch 445, to load counter 440 by the combination of the signal on line 483 and the pulse on line 493, to load counter 442 by means of the signal on line 484 and the pulse on line 494 and to set latches 455 and 457 by means of the pulses on lines 489 and 490.

The setting of latch 457 allows the subsequent clock pulse on line 465 to be transmitted to AND circuit 501. As we are not yet at the end of line, latch 454 continues to supply a reset output to AND circuit 501, and, assuming that the scan line buffer remains in the ready state, a signal is supplied therefrom on line 500 to AND circuit 501. The recognition of further runs proceeds in a manner identical to that described for recognizing the first run of the scan line.

The end of line situation will now be discussed. Upon encountering the seventh clock pulse to strobe the scan line buffers, counter 452 goes to zero. As previously described, this count results in the application of a signal to AND circuit 521, which, since latch 453 is reset, is transmitted onto line 527. The signal on line 527 therefore enables AND circuit 528 to transmit the next appearing clock pulse.

Two conditions are possible. The last data bit of the scan line is either a 0 or a 1. If the last data bit is a 1, the event recognizer circuitry will transmit a regular event designation signal on line 12 and an event designation number on cable 11 indicating the number of zeroes preceding the 1 bit, or the event recognizer circuitry will transmit the special event designation No. 2 to indicate that the last data bit was a one which was preceded by a 1 bit. Subsequently, the event recognizer circuitry will transmit an end of line event designation which is special event No. 1. On the other hand, if the last data bit of the scan line is a 0, no regular or special events indicating runs will be transmitted. Rather, only the end of line special event designation will be transmitted.

Preparatory to receipt by event recognition circuitry of the last data bit of a scan line, AND circuits 482, 501, 512 and 528 are enabled. AND circuit 509 may also be enabled, depending upon whether the previous data bit was a 0. A clock pulse on line 465 is therefore transmitted via AND circuit 482 and AND circuit 501 to line 437 and to AND circuits 502, 509, 512 and 528. The clock pulse on line 437 operates to strobe the scan line buffers to acknowledge the data bit on line 436. If the data bit is a 0, nothing occurs at AND circuit 502. If, however, the the data bit is a 1, AND circuit 502 operates to transmit the pulse, via OR circuits 503 and 474, to latches 450 and 457. This will operate the latches to prevent application of the next clock pulse to the event recognizer circuitry and to supply a signal on line 13 to the encoder circuitry 14 of FIG. 1. Whether or not the data bit is a 1, AND circuit 509, if enabled, transmits the clock pulse to latch 445 and to counter 442. This results in the application of the proper regular event designation number to gate 443. Also, the clock pulse is transmitted by AND circuit 528 to input 532 of latch 454. This operates the latch to the set condition to terminate the reset output therefrom to AND circuit 501 and thereby block any further clock pulses from transmittal to the scan line buffers 432. This also operates the latch to supply a signal from the set output to AND circuit 533, enabling the AND circuit for the next clock pulse from AND circuit 482.

Lastly, the clock pulse is transmitted by AND circuit 512 and OR circuit 476 to the set input of latch 453.

The latch is therefore set to terminate the output on line 520, which thereby blocks AND circuits 521 and 528. The latch also supplies a signal on line 516 to input 517 of counter 452. Thus, counter 452 is in condition to be loaded upon subsequent enabling of AND circuit 501 for beginning the next scan line.

As previously described, if the last data bit of the scan line were a one, latch 457 is reset and latch 450 is set, so that a signal on line 13 indicates to the encoder the availability of an event designation on cable 11 and line 12. As before, the encoder circuitry signals acceptance of the event designation by application of a pulse on line 15. This pulse resets latch 450, and leaves latch 457 reset, so that the next clock pulse on line 465 serves to set latches 457, 445 and 455, and to load counter 440 with a count of 2.

It will be recalled that if the last data bit of the scan line were a 0, latch 445 remains reset and counter 440 remains set with the count of 2, it having not been pulsed subsequent to loading.

Upon acceptance by encoder 14 of the event information particularized by a 1 data bit at the end of the scan line, followed by one clock pulse on line 464, or upon the event recognizer circuitry operating without further response to a 0 data bit at the end of the scan line, latch 457 is in the set condition, latch 450 is in the reset condition and counter 440 holds the value 2. The next clock pulse on line 465 is thus transmitted by AND circuit 482 to AND circuit 533. As latch 454 was previously set to indicate that the previous data bit was at the end of a scan line, AND circuit 533 gates the clock pulse, which is blocked by AND circuit 501. Thus, no further data is acknowledged from the scan line buffers 432 by AND circuit 501 and line 437.

The clock pulse from AND circuit 533 is supplied via OR circuit 487 to input 491 of latch 445 and to pulse input 493 of counter 440. This operates to set latch 445, if it is not already in that condition, so that it supplies a signal on line 12 and enables gate 441. The pulse also operates to decrement counter 440 to a binary condition of 1.

The pulse output AND circuit 533 is also supplied to OR circuit 503, which transmits the signal, via OR circuit 474, to reset latch 457 and to set latch 450. Latch 450 therefore indicates by means of a signal on line 13 that data is available on line 12 and cable 11. As discussed, this data is available on line 12 and cable 11. As discussed, this data comprises special event No. 1, the end of line event designation.

Lastly, the pulse output of AND circuit 533 is supplied via OR circuit 475 to reset latch 454. The latch thus indicates that the end-of-line condition is terminated, and supplies an output signal to AND circuit 501 to ready the event recognizer circuitry to again strobe the scan line buffers 432, depending upon the presence of the ready signal therefrom on line 500.

The apparatus illustrated in FIG. 21 is merely an example of an event recognizer 10 in FIG. 1 for supplying various event designations to encoder circuitry 14. Many alternative types of event recognizers may be employed to supply suitable data to the described compression encoding and decoding apparatus.

Figure 22:
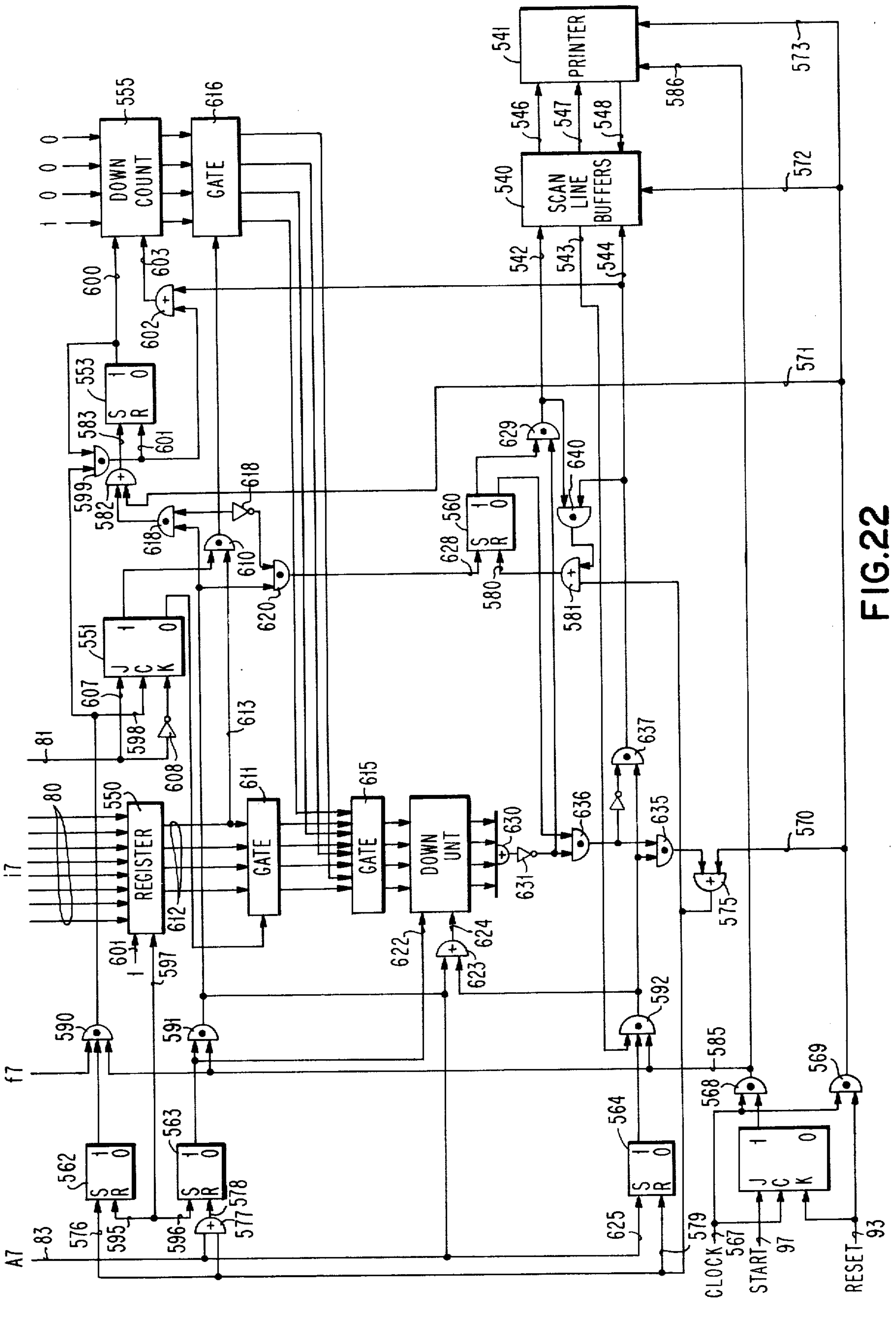
FIG. 22 is a detailed block diagram of an embodiment of an event regenerator 50 of FIG. 2.

Referring now to FIG. 22, an exemplary event regenerator 50 of FIG. 2 is illustrated in detail. As with respect to event recognizer 10 in FIG. 1, the event regenerator in FIG. 22 comprises merely one exemplary type, of which many types are known in the art. The only requirement is that it accept event designations from decoder 51 in FIG. 2 and generate the data particularized by the event designations from the decoder. The event regenerator must therefore be consistent with the corresponding event recognizer so as to reproduce the original data.

In FIG. 22, the interconnections between the event regenerator and the decoder 51 of FIG. 2 include event designation cable 80, special event designation line 81, data available line 82 and acceptance pulse line 83. The event regenerator circuitry responds to the supplied event designations by converting the designations into strings of data bits which are supplied to scan line buffers 540 which transmit the data to a printer 541. Interconnections between the event regenerator circuitry and scan line buffers 540 is by way of lines 542, 543 and 544. The same data is subsequently transmitted to printer 541 by means of lines 546, 547 and 548. In each instance, a 1 data bit is represented by the presence of a signal on line 542 in conjunction with a clock pulse on line 544, or by a signal on line 546 in conjunction with an availability signal on line 547. A 0 bit is represented by the absence of a signal on line 542 in conjunction with a clock pulse on line 544, or by the absence of a signal on line 546 in conjunction with an availability signal on line 547.

Scan line buffers 540 are illustrated hereinafter. Printer 541 may comprise any commercially available printer which will respond to the supplied data, for example, one of the wire print type.

The event regenerator circuitry includes a register 550 for receiving the event designation number from cable 80, and a latch 551 for responding to line 81 to indicate whether the designated event in special or regular. Latch 553 indicates the start of each scan line, and counter 555 counts to determine the end of each scan line. Counter 558 is a run counter that controls the number of 0 data bits transmitted to the scan line buffers, and latch 560 supplies all the 1 data bits to be transmitted.

Lastly, latches 562, 563 and 564 control the operation of the event regenerator circuitry.

The reset and start signals from FIG. 3 are applied to clock latch 565 in FIG. 22. Clock 567 supplies its output to latch 565 and to AND circuitr 568 and 569. A reset signal at line 93 is applied to the reset input of latch 565 and to AND circuit 569. The next clock pulse from clock 567, in combination with the reset input, operates latch 565 to the reset condition. The combination of the clock pulse and the reset input at AND circuit 569 transmits the reset pulse to lines 570, 571, 572 and 573.

The reset pulse on line 572 operates to reset the scan line buffers 540, and the pulse on line 573 operates to reset printer 541. The reset pulse on line 570 is transmitted by OR circuit 575 to input 576 of latch 562; via OR circuit 577, to input 578 of latch 563; to input 579 of latch 564; and, via OR circuit 581, to input 580 of latch 560. Line 571 transmits the reset pulse, via OR circuit 582, to input 583 of latch 553.

Thus, the reset pulse has the effect of setting latches 562 and 553, and resetting latches 563, 564 and 560.

Next, the start signal is applied on line 97 to latch 565. The next appearing clock pulse from clock 567 operates to set the latch so that it supplies an output to AND circuit 568. Successive clock pulses are thus gated by AND circuit 568 via line 586 to printer 541, and via line 585 to AND circuits 590, 591 and 592.

Since latches 563 and 564 were reset by the reset pulse, the absence of a signal from the set outputs of these latches serves to block clock pulses reaching AND circuits 591 and 592. However, since latch 562 was set by the reset pulse, the set output of latch 562 provides an enabling input to AND circuit 590. The remaining enabling input to AND circuit 590 is line 82. A signal on line 82 indicates that an event designation is present and ready for transmission on cable 80 and line 81 from the decoder 51 in FIG. 2.

Upon the occurrence of the signal on line 82 to indicate the presence of data on cable 80 and line 81, AND circuit 590 is enabled to transmit a subsequent clock pulse. The first following clock pulse is transmitted to input 595 of latch 562, to input 596 of latch 563, to input 597 of register 550, to input 598 of clock latch 551, and to AND circuit 599.

The clock pulse at input 595 of latch 562 resets that latch, disabling AND circuit 590. The pulse on input 596 of latch 563 sets that latch to enable AND circuit 591 to transmit a subsequent clock pulse from line 585.

The clock pulse on line 597, together with the continuing input on line 605, operate register 550 to load the event designation number from cable 80. The event designation number from register 550 is then supplied on line 612 to gate 611. The rightmost bit of the event designation number from register 550 is additionally supplied on line 613 to AND circuit 610.

A special event is indicated by a signal on line 81, while a regular event is indicated by the absence of the signal. Line 81 is connected to input 607 of latch 551 and to inverter 608. A special event signal on line 81, as applied to input 607, together with the clock pulse from AND circuit 590 on input 598, sets latch 551. The absence of a special event signal on line 81 operates inverter 608 to suppply an input to latch 551. This input, together with the clock pulse at input 598, operates to reset latch 551. Thus, the special event signal operates to reset latch 551. Thus, the special event signal operates to set latch 551 to supply an output signal to AND circuit 610. The absence of a special event signal operates latch 551 to supply an output signal to the enabling input of gate 611.

As latch 553 was set by the reset pulse on line 571, the latch has supplied signals to input 600 of counter 555 and to AND circuit 599. Thus, AND circuit 599 is enabled to transmit the clock pulse from AND circuit 590 to input 601 of latch 553 and, via OR circuit 602, to input 603 of counter 555. The clock pulse from AND gate 599 at input 603 of counter 555, operates in combination with the set output of latch 553 at input 600, to load counter 555 with the fixed input of the binary value of 8. The clock pulse additionally is applied to input 601 of latch 553 to reset the latch and subsequently terminate the signals to AND circuit 599 and to input 600 of counter 555.

The preceding has described in detail the functions of the first clock pulse on line 585 following the setting of latch 562 and the occurrence of a signal on line 82. In summary, these functions include resetting latch 562, setting latch 563, and loading event designation data into register 550 and latch 551. In continuing operation, the first clock pulse of each event regeneration performs these same three functions.

The second pulse from clock 567 on line 585 is blocked by AND circuit 590 due to the reset status of latch 562, is transmitted by AND circuit 591 due to the set status of latch 563, and is blocked by AND circuit 592 because of the reset status of latch 564. The set output of latch 563 is also supplied to input 622 of counter 558.

The second clock pulse is thus transmitted by AND circuit 591 to input 625 of latch 564; via OR circuit 577, to input 578 of latch 563; on line 83 to decoder 51 of FIG. 2; to AND circuits 618 and 620; and via OR circuit 623, to input 624 of counter 558.

The clock pulse at input 578 of latch 563 resets that latch, disabling AND circuit 591. The pulse on input 625 of latch 564 sets that latch to enable AND circuit 592 to transmit one or more subsequent clock pulses from line 585. The pulse on line 83 acknowledge to decoder 51 of FIG. 2 the receipt of event designation data on cable 80 and line 81.

AND circuits 618 and 620 operate in the alternative. If the supplied event designation were special event No. 1, which represents the end-of-line condition, then the signals from the set output of latch 551 and the rightmost bit position of register 550 cause AND circuit 610 to apply a signal to AND circuit 618 and to inverter 619. The inverted signal from inverter 619 thus blocks AND circuit 620, while AND circuit 618 is operated to transmit the clock pulse, via OR circuit 582, to input 583 of latch 553. This sets the latch to provide signals to AND circuit 599 and to input 600 of counter 555. These signals will respond to the next supplied event designation to load counter 555 with a binary 8.

If the received event designation was other than special event No. 1, then the absence of a signal from AND circuit 610 serves in conjunction with inverter 619 to enable AND circuit 620 and to block AND circuit 618. The clock pulse is thus transmitted by AND circuit 620 to input 628 of latch 560. The clock pulse therefore sets the latch to provide an output signal to AND circuit 629. As will be described, the set output of latch 560 thus enables AND circuit 629 to provide a 1 data bit on line 542 upon counter 558 being loaded with, or decrementing to, 0.

The clock pulse from AND circuit 591 is also applied to input 624 of counter 558. The combination of this input pulse with the signal on input 622 from latch 563, operates to load counter 558 with the output of OR circuit 615. Now the output of OR circuit 615 has one of three possible values, depending upon the particular event designation. If the evént is a regular event, then the signal from reset output of latch 551 enables gate 611, while the absence of a signal from the set output of this latch blocks AND circuit 610 which enables gate 616; in this case, the event designation number in register 550 is loaded into counter 558. On the other hand, if the event is special event No. 1, then the absence of a signal from the reset output of latch 551 disables gate 611, while the signals from the rightmost bit position of register 550 and the set output of latch 551 cause AND circuit 60 to enable gate 616; in this case the contents of counter 555 is loaded into counter 558. Finally, if the event is neither a regular event nor special event No. 1, that is, if the event is special event No. 2, then both gates 611 and 616 are disabled; in this case counter 558 is loaded with all zeroes.

The preceding has described in detail the functions of the second clock pulse on line 585 following the setting of latch 562 and the occurrence of a signal on line 82. In summary, these functions include resetting latch 563, setting latch 564, transmitting an acceptance pulse on line 83 to decoder 51 of FIG. 2, loading counter 558, and possibly setting latch 560.

Subsequent clock pulses from clock 567 on line 585 are blocked by AND circuits 590 and 591, because latches 562 and 563 are in the reset condition. Since latch 564 is set, the signal from the set output of this latch provides an enabling input to AND circuit 592. The remaining enabling input to AND circuit is line 543; a signal on line 543 indicates that the scan line buffers 540 are ready to accept information from the event regenerator circuitry.

Upon the occurrence of a signal on line 543 to indicate that the scan line buffers 540 are ready to accept data, AND circuit 592 is enabled to transmit clock pulses appearing on line 585. Subsequent clock pulses are thus transmitted by AND circuit 592, via OR circuit 623, to input 624 of counter 558, and to AND circuits 635 and 637.

Since latch 593 is in the reset condition, the absence of a signal from the set output of this latch causes the absence of a signal on input 622 of counter 558. The absence of a signal on input 622 enables clock pulses appearing on input 624 to decrement counter 558.

AND circuits 635 and 637 operate in the alternative, under the control of AND circuit 632. The presence of a signal from AND circuit 632 enables AND circuit 635 to transmit clock pulses, while inverter 636 acts to block AND circuit 637. Conversely, the absence of a signal from AND circuit 632 blocks AND circuit 635, while inverter 636 supplies an enabling signal to AND circuit 637.

If counter 558 was loaded with a number other than zero, then it supplies at least one positive output to OR circuit 630. OR circuit 630 therefore supplies a signal to inverter 631, which supplies no signal to AND circuits 639 and 632. The resulting absence of a signal from AND circuit 629 is interpreted as a 0 data bit at input 542 of scan line buffers 540. The absence of a signal from AND circuit 632 blocks AND circuit 635 and causes inverter 636 to enable AND circuit 637, as previously described, so that a clock pulse transmitted by AND circuit 592 is supplied to AND circuit 640; via OR circuit 602 to input 603 of counter 555; and to input 544 of scan line buffers 540. The clock pulse at AND circuit 640 is blocked by the absence of a signal from AND circuit 629. The clock pulse at input 603 of counter 555, in conjunction with the absence of a signal on input 602 from the set output of latch 553, operates to decrement counter 555. As will be explained, the clock pulse on line 544 to scan line buffers 640 causes the buffers to accept the 0 data bit available on line 542.

If counter 558 was loaded with the number 0 or upon the decrementing of that counter to 0, OR circuit 630 provides no output signal to inverter 631. The inverter therefore supplies a signal to AND circuits 629 and 632. The outputs of these AND circuits are thus controlled by latch 560.

Latch 560 has been set if a 1 data bit is to be transmitted to scan line buffers 560, following the transmission of a number of 0 data bits equal to the number loaded into counter 558; that is, latch 560 has been set unless the event designation specified special event No. 1. If latch 560 has been set, then the set output of this latch causes AND circuit 629 to provide a signal which is interpreted as a one data bit at input 542 of scan line buffers. The absence of a signal from the reset output of latch 560 causes a corresponding absence of a signal from AND circuit 632, which disables AND circuit 635 and causes inverter 636 to enable AND circuit 637, as previously described. Therefore, a clock pulse transmitted by AND circuit 592 is supplied by AND circuit 637 to AND circuit 640; via OR circuit 602, to input 603 of counter 555; and to input 544 of scan line buffers 540.

The signal from AND circuit 629 enables AND circuit 640 to transmit the clock pulse, via OR circuit 581, to input 580 of latch 560, thereby resetting the latch. The clock pulse at input 603 of counter 555, in conjunction with the continuing absence of a signal from the set output of latch 553, decrements that counter. The clock pulse on line 544 causes scan line buffers 640 to accept the 1 data bit available on line 542.

Finally, upon counter 558 being set to zero, or being decremented to zero, and upon latch 560 being reset, OR circuit 630 supplies no signal to inverter 631. Inverter 631 and the reset output of latch 560 thus both supply signals to AND circuit 632, which therefore supplies a signal to AND circuit 635 and to inverter 636. This signal enables AND circuit 635 and causes inverter 636 to block AND circuit 637. The next clock pulse transmitted by AND circuit 529 is thus supplied by AND circuit 635, via OR circuit 575, to input 576 of latch 562; via OR circuit 577, to input 578 of latch 563; to input 579 of latch 564; and via OR circuit 581 to input 580 of latch 560. Thus, latch 562 is set and latches 563, 564 and 560 are reset. The event regenerator circuitry is thereby placed in the ready to receive condition for accepting the next event designation from decoder 51 in FIG. 2.

Figure 23:
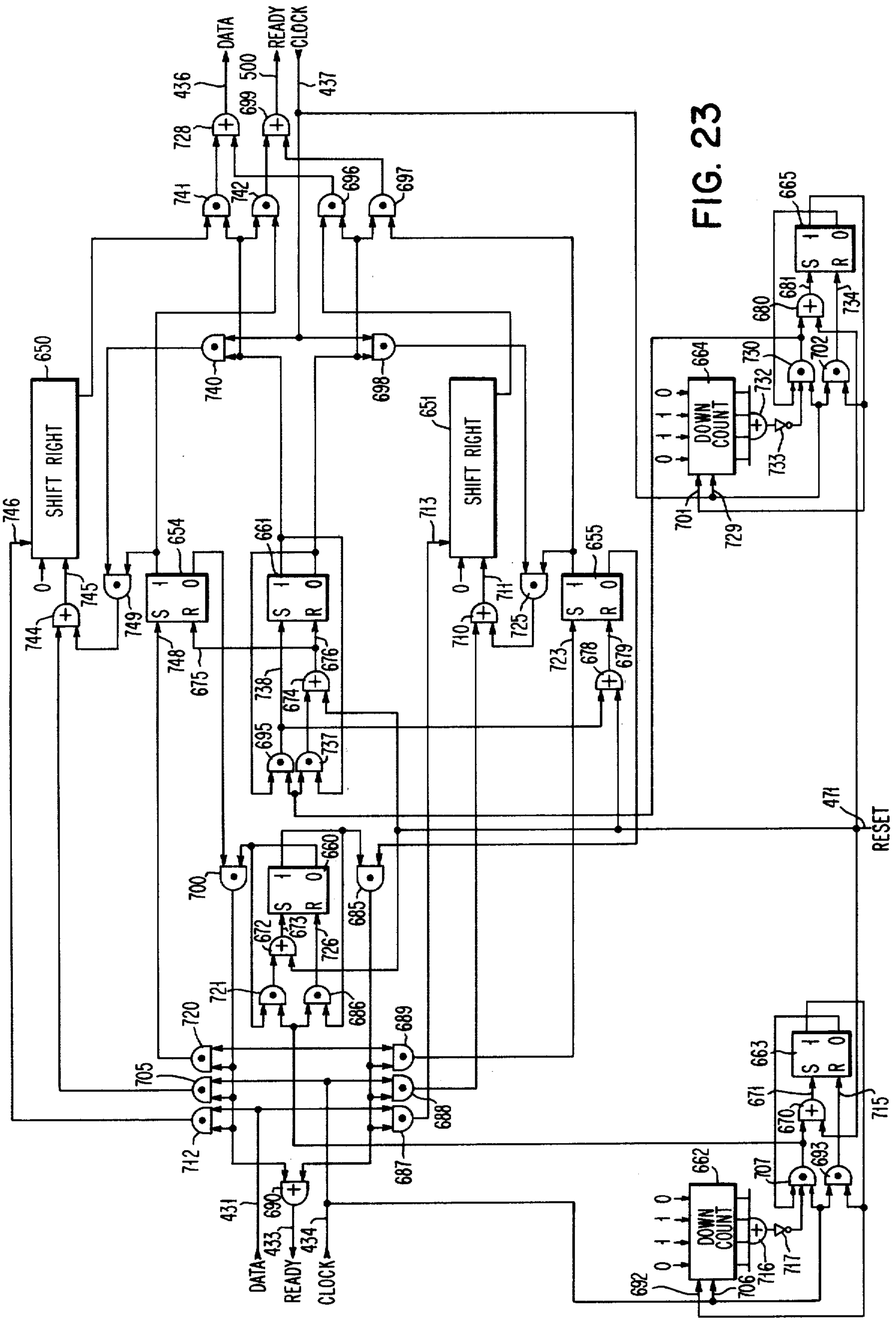
FIG. 23 is a detailed block diagram of scan line buffers 432 in FIG. 21 and scan line buffers 540 of FIG. 22.

Scan line buffers 432 in FIG. 21 and scan line buffers 540 in FIG. 22 can be identical. For the purpose of illustration, one possible implementation for the scan line buffers 432 in FIG. 21 is shown in FIG. 23.

The scan line buffers include primarily two shift right registers 650 and 651. During one cycle, register 650 will be supplying data at the output 436 while shift register 651 is receiving data from input 431. During the subsequent cycle, the shift registers will alternate such that shift register 650 will be receiving data from input 431 while shift register 651 will be supplying data to output 436.

Latch 654 indicates whether register 650 is available to receive or transmit data, and latch 655 provides the same indication for shift register 651. Both latches provide their reset output to the input side of the buffer circuitry and their set output to the output side of the buffer circuitry.

Latch 660 selects the buffer to respond to the input data, and latch 661 selects the shift register to supply the output data. Counter 662 counts the input clock pulses and latch 663 responds to the counter to control the input buffer selection. Counter 664 counts the clock pulses from the output side and latch 665 controls the output buffer selection.

To begin a new operation, a reset pulse is applied on line 471. The reset pulse is supplied, via OR circuit 670, to input 671 of latch 663; via OR circuit 672, to input 673 of latch 660; via OR circuit 674, to input 675 of latch 654 and input 676 of latch 661; via OR circuit 678, to input 679 of latch 655; and, via OR circuit 680, to input 681 of latch 665. The reset pulse thus sets latches 660, 663 and 665, and resets latches 654, 661 and 655.

The set output of latch 660 is supplied to AND circuits 685 and 686. The reset output of latch 655 is also supplied to AND circuit 685. Thus, the AND circuit supplies an output signal to AND circuits 687, 688 and 689. In addition, the output signal is transmitted, via OR circuit 690, to line 433. This indicates to the input source of data that the buffer, in particular shift register 651, is available for accepting the input data. At the same time, the set output of latch 663 is supplied to input 692 of counter 662 and to AND circuit 693. The signal at input 692 of counter 662 enables the counter to be loaded upon appearance of the first clock pulse at input 434. Finally, the absence of a signal from the reset output of latch 660 causes the absence of a signal from AND circuit 700, which blocks AND circuits 720, 705 and 712. The buffer circuitry is therefore set to receive input data, which is directed to shift register 651.

The reset output of latch 661 is supplied to AND circuits 695, 969, 697 and 698. It thus selects register 651 as the next available output buffer. However, latch 655 is currently reset to indicate that register 651 is available for receiving input data, and therefore unavailable for transmitting output data. Therefore, no signal is supplied to AND circuit 697, which blocks a ready signal from OR circuit 699 and from line 500. At the same time, latch 654 supplies its reset output to AND circuit 700, and latch 655 supplies its set output to input 701 of counter 664 and to AND circuit 702.

As the result of the reset pulse on line 471, the buffer circuitry is thus arranged to receive data from input 431 and clock pulses on line 434, but unavailable to transmit data on output line 436.

After transmission of the ready signal on line 433, a series of clock pulses may be received on line 434 accompanied by some or no data signals on line 431. The first such clock pulse is applied to AND circuits 705 and 688, to input 706 of counter 662 and to AND circuits 707 and 693. The clock pulse is blocked by AND circuit 705, but is transmitted by AND circuit 688, via OR circuit 710, to input 711 of shift register 651. If the data bit accompanying the clock pulse is a 1, then a signal appears on line 431 to AND circuits 712 and 687. The data bit is blocked by AND circuit 712, but is transmitted by AND circuit 687 to input 713 of shift register 651. The combination of a data signal at input 713 in conjunction with a clock pulse at input 711 operates the shift register to shift a one into the leftmost position of the register, as the remainder of the register is shifted to the right. If no data signal is supplied at input 713 at the same time as the clock pulse at input 711, the shift register shifts to the right one position, thereby shifting a 0 into the first bit position.

The clock pulse at input 706 of counter 662, in conjuction with the signal from the set output of latch 663 at input 692, causes the counter to be loaded with the binary value 6 fixed as its input. The signal from the set output of latch 663 also enables AND circuit 693 so that the clock pulse is transmitted thereby to input 715 of latch 663. This causes the latch to reset, terminating the signal at input 692 to counter 662, and blocking AND circuit 693. The reset output of latch 663 then comprises one of the enabling inputs of AND circuit 707.

Subsequent clock pulses similarly shift data into shift register 651 and are applied to input 706 of counter 662, decrementing the counter. As long as the counter contains a value greater than zero, it continually supplies an output signal at at least one of its outputs or to OR circuit 716. This output is inverted by inverter 717 to supply no signal to AND circuit 707, thereby blocking the AND circuit.

The seventh clock pulse at line 434 decrements counter 662 to 0. Subsequently, its all zero output at OR circuit 716 results in inverter 717 supplying a positive enabling signal to AND gate 707. The eighth clock pulse appearing on line 434 is therefore gated by AND circuit 707 to OR circuit 670, and to AND circuits 720, 721, 686 and 689.

The clock pulse transmitted by OR circuit 670 to input 671 of latch 663 causes the latch to be set, so that it again provides a loading signal at input 692 of counter 662.

The set output of latch 660 has resulted in the enabling of AND circuits 686 and 689. The clock pulse transmitted by AND circuits 707 and 689 is applied to input 723 of latch 655, thereby setting the latch. The latch thus applies enabling signals to AND circuits 725 and 697. Since latch 661 was in the reset state as the result of the reset pulse at line 471, AND circuit 697 is thus enabled to transmit the output of latch 655, via OR circuit 699, to line 500. This signal therefore indicates that register 651, the buffer in particular, is ready to transmit data to the output.

Lastly, the clock pulse from AND circuit 707 is transmitted by AND circuit 686 to input 726 of latch 660. This resets the latch, terminating its enabling output to AND circuits 686 and 685. The previous setting of latch 655 also terminated the other input to AND circuit 685, so that the enabling inputs of AND circuits 687, 688 and 689 are already terminated. The reset output of latch 660 therefore applies signals to AND circuit 721 and AND circuit 700. Since latch 654 was already reset by the reset pulse at line 471, the output therefrom previously enabled AND circuit 700. Therefore, the reset output of latch 660 is transmitted thereby to enable AND circuits 712, 705 and 720, and further to be transmitted by OR circuit 690 to line 433. This indicates that the buffer, in particular shift register 650, is available for the receipt of data from the input.

Shift registers 650 and 651 are therefore now in condition to receive data from the input source and, independently, to transmit data to the output receiver.

The outputting of data from register 651 is done in response to the clock pulses received at line 437. Each clock pulse is transmitted by AND circuit 698, AND circuit 725 and OR circuit 710 to input 711 of shift register 651. The shift register responds to each applied clock pulse by shifting to the right and supplying the successive bits to AND circuit 696. AND circuit 696 remains enabled by latch 661, so that the data bits are transmitted via OR circuit 728 to data line 436.

Each clock pulse is also applied to input 729 of counter 664 and to AND circuits 730 and 702. The first clock pulse at input 729, together with the signal supplied at input 701 by the set output of latch 665, causes counter 664 to load the permanently affixed binary value of 6 therein. Since latch 665 was set by the reset clock pulse, the signal from the set output of this latch enables AND circuit 702, while the absence of a signal from the reset output of this latch blocks AND circuit 730. The first clock pulse is thus transmitted by enabled AND circuit 702 to input 734 of latch 665. This pulse resets the latch, terminating the signals at input 701 of counter 664 and at AND circuit 702. The reset output of the latch is applied to AND circuit 730.

Thus, as with respect to counter 662, counter 664 will decrement with each further applied clock pulse until the seventh clock pulse decrements the clock counter to 0. Then, the absence of a signal from OR circuit 732 causes inverter 733 to apply an enabling signal to AND circuit 730. The eighth applied clock pulse is therefore gated by the AND circuit 730, via OR circuit 680, to input 681 of latch 665, and to AND circuits 795 and 737. The pulse at latch 665 causes the latch to set, again providing a loading signal at input 701 of counter 664.

As latch 661 is in the reset condition, the clock pulse is transmitted by AND circuit 695 to input 738 of the latch. This sets the latch, so that it provides outputs to AND circuits 737, 740, 741 and 742. This indicates that shift register 650 will be selected to provide the output data, when latch 654 indicates that it is available.

The output of AND circuit 695 is also applied, via OR circuit 678 to input 679 of latch 655. This resets the latch to terminate the set output therefrom; the resulting reset output from this latch is supplied to AND circuit 685. This indicates that shift register 651 is available to receive data from the input, when latch 660 indicates that this register is selected.

Register 650 is operated in an identical fashion to that of register 651. Briefly discussed, the clock pulses from the input are supplied thereto, via AND circuit 705 and OR circuit 744. The clock pulses are thus applied to input 745 of the shift register. The input data is applied, via AND circuit 712, to input 746 of the shift register. When shift register 650 is loaded, counter 662 supplies a signal, via AND circuit 720, to input 748 of latch 654. This sets the latch, turning off the reset output which had enabled AND circuits 712, 705 and 720. The set output of latch 654 is supplied to AND circuit 749 and to AND circuit 742. AND circuit 749 is thus enabled to transmit any clock pulses from the output device at line 437. The signal at AND circuit 742 indicates that shift register 650 is ready to transmit data to the output, depending upon selection thereof by latch 661, via the set output thereof. If both latches 654 and 661 are set, AND circuit 742 supplies a signal, via OR circuit 699, to line 500. The clock pulses are then supplied from the output device on line 437, via AND circuits 740 and 749, and OR circuit 744, to operate the shift register 650. The shift register thus supplies the output data, via AND circuit 741 and OR circuit 728, to line 436. Counter 644 also responds to the clock pulses by counting sufficient bits to indicate a scan line.

The exemplary scan line buffers 432 in FIG. 21 have been described in detail, and can be identical to the scan line buffers 540 in FIG. 22. Other types of buffer mechanisms may be used equally well, and the arrangement of FIG. 23 is provided on an exemplary basis.

The shift registers, registers, decrementing counters, incrementing counters, adders, AND circuits or gates, OR circuits, clocked latches, latches, clocks and inverters are all commercially available semiconductor circuits of which interconnection in the manner shown by the present drawings and specification would be apparent to those skilled in the art. It is envisioned that similar circuit elements may be connected in similar manners to perform the same functions in a similar way.

While the invention has been particularly shown and described with reference to preferred embodiments thereof, it will be understood by those skilled in the art that various changes in form and details may be made therein without departing from the spirit and scope of the invention.

What is claimed is:

1. An apparatus (FIGS. 2 and 9) for decoding variable length code words $y$ into symbols $s$ and $i$ indicative of extended run length code words where $s$ designates either that the number $i$ represents one of $n-f$ code words for ordinary runs of lengths $f$ through $n-1$, or that the number $i$ represents one of $m+f$ code words for special evants, taken as any of $m$ special situations, runs of lengths $l$ through $f-1$, or runs of lengths $n$, where $f$ is the most frequently occurring run length, the variable length code words being constrained such that the maximum code word length is bounded by a quantity $L_{max} \geq \log_2(m+n)$ and all code word lengths are ordered according to the formulas $$1 \leq L_r(1) \leq L_r(2) \leq \ldots \leq L_r(n-f) \leq L_{max}$$
$$1 \leq L_s(1) \leq L_s(2) \leq \ldots \leq L_s(m+f) \leq L_{max}$$

the apparatus comprising:

a first stored table TS, a second stored table TR, a third stored table BR, and a fourth stored table TR (52, 53);

means for accumulating successive codeword bits $Y_1$, $Y_2, \ldots, Y_k$ to form a single integer $Y=Y_1Y_2 \ldots Y_k$;

means (51) for comparing $Y$ with successive elements of the TS table such ath if $Y \geq t_s(k)$, then another bit of $y$ is accumulated; if $y<t_s(k)$, then the codeword $y$ is decoded;

means (51) for comparing $y$ with successive elements of the TR table and, if $y<t_r(k)$, for computing the values $s$ and $i$ from $y$ and the table values $t_r(k)$ and $b_r(k)$, such that $s=0$ and $i=y-t_r(k)+b_r(k)+1$, thus signifying that $y$ is the ith regular code word $c_r(i)$; and means (51) for comparing y with successive elements of the TR table and, if $y \geq t_r(k)$, for computing the values $s$ and $i$ from $y$ and the table values $t_s(k)$ and $b_s(k)$, such that $s=1$ and $i=y-t_s(k)+b_s(k)+1$, thus signifying that $y$ is the ith special code word $c_s(i)$.

2. An apparatus according to claim 1, wherein $b_r(k)$=number of regular code words with length $k$ or less; $b_s(k)$=number of special code words with length $k$ or less;

$$t_r(k) = \sum_{i=1}^{b_r(k)} 2^{k-L_r(i)} + \sum_{j=1}^{b_s(k-1)} 2hu\ k^{-}L_s(j)\ j$$

$$t_s(k) = \sum_{i=1}^{b_s(k)} 2^{k-L_r(i)} + \sum_{j=1}^{b_s(k)} 2^{k-L_s(j)}\ j$$

$c_r(i)=t_r(L_r(i))-b_r(L_r(i))+i-1$; and
$c_s(j)=t_s(L_s(j))-b_s(j))+j-1$.

* * * * *

UNITED STATES PATENT OFFICE
CERTIFICATE OF CORRECTION

Patent No. 3,925,780 Dated December 9, 1975

Inventor(s) David C. Van Voorhis

It is certified that error appears in the above-identified patent and that said Letters Patent are hereby corrected as shown below:

Claim 2 should read as shown below:

2. An apparatus according to claim 1, wherein $b_r(k)$=number of regular code words with length k or less;

$b_s(k)$=number of special code words with length k or less;

$$t_r(k)=\sum_{i=1}^{b_r(k)} 2^{k-L_r(i)}+\sum_{j=1}^{b_s(k-1)} 2^{k-L_s(j)};$$

$$t_s(k)=\sum_{i=1}^{b_s(k)} 2^{k-L_r(i)}+\sum_{j=1}^{b_s(k)} 2^{k-L_s(j)};$$

$c_r(i)=t_r(L_r(i))-b_r(L_r(i))+i-1$; and $c_s(j)=t_s(L_s(j))-b_s(L_s(j))+j-1$.

Signed and Sealed this

*twenty-ninth* Day of *June 1976*

[SEAL]

*Attest:*

RUTH C. MASON
*Attesting Officer*

C. MARSHALL DANN
*Commissioner of Patents and Trademarks*